(12) United States Patent
Wada et al.

(10) Patent No.: US 7,148,832 B2
(45) Date of Patent: Dec. 12, 2006

(54) ANALOG DIGITAL CONVERTER HAVING A FUNCTION OF DYNAMIC ADJUSTMENT CORRESPONDING TO THE STATE OF THE SYSTEM

(75) Inventors: Atsushi Wada, Ogaki (JP); Kuniyuki Tani, Ogaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 11/140,964

(22) Filed: Jun. 1, 2005

(65) Prior Publication Data

US 2005/0270215 A1    Dec. 8, 2005

(30) Foreign Application Priority Data

Jun. 1, 2004   (JP) .............................. 2004-163204
May 2, 2005   (JP) .............................. 2005-134185

(51) Int. Cl.
    *H03M 1/12*   (2006.01)
(52) U.S. Cl. ........................ 341/155; 341/120
(58) Field of Classification Search ......... 341/120–172
    See application file for complete search history.

(56) References Cited

U.S. PATENT DOCUMENTS 5,343,200 A * 8/1994 Matsui ....................... 341/139
5,838,738 A * 11/1998 Zook ........................... 341/59
6,999,018 B1* 2/2006 Aeby et al. .................. 341/155

FOREIGN PATENT DOCUMENTS

| JP | 402186831 A | * | 7/1990 |
| JP | 404137821 A | * | 10/1992 |
| JP | 404291822 A | * | 10/1992 |
| JP | 2001-078088 | | 3/2001 |

* cited by examiner

*Primary Examiner*—Lam T. Mai
(74) *Attorney, Agent, or Firm*—McDermott Will & Emery LLP

(57) ABSTRACT

A DSP calculates time integration of the light amount received by a CCD, using an input image. Determination is made regarding whether or not the light amount is equal to or smaller than a predetermined threshold. In a case that the light amount is equal to or smaller than the predetermined threshold, the DSP outputs a control signal to an AD converter for operation in the 8-bit mode. In a case that the light amount is greater than the threshold, the DSP outputs a control signal to the AD converter for operation in the 10-bit mode. The AD converter has a function of dynamic adjustment of conversion bits according to control from the DSP.

9 Claims, 20 Drawing Sheets

ANALOG DIGITAL CONVERTER HAVING A FUNCTION OF DYNAMIC ADJUSTMENT CORRESPONDING TO THE STATE OF THE SYSTEM

BACKGROUND OF THE INVENTION

1. Field of the Invention

The present invention relates to an analog digital converter, a signal processing system using the same, and an imaging device, and particularly to an analog digital converter, a signal processing system using the same, and an imaging device, mounted on a system LSI (Large Scale Integration) or the like.

2. Description of the Related Art

In recent years, system LSIs have come to be mounted on mobile devices such as digital still cameras and so forth. With the system LSI, a device is designed using multiple single-function LSIs. This enables simple wiring, as well as reduced area of LSIs. Thus, the system LSI has the advantage of allowing the user to design a device with a small size.

A system of a digital CCD camera is disclosed in Patent document 1.

[Patent Document 1]
Japanese Patent Application Laid-open No. 2001-78088

A system disclosed in Patent Document 1 and shown in FIG. 1 thereof includes an AD (Analog Digital) converter 3. The AD converter 3 is formed with a fixed specification. Accordingly, with a system which requires 8-bit precision in normal operation, but requires 10-bit precision in special operation, such a system requires an AD converter with a 10-bit specification.

An AD converter with a 10-bit specification leads to larger power consumption than that of an AD converter with an 8-bit specification due to difference in power consumption between 8-bit operation and 10-bit operation. Accordingly, the AD converter of a system, which requires high-precision signal processing in special operation, leads to excessive power consumption in normal operation.

SUMMARY OF THE INVENTION

The present invention has been made in view of the above problems, and accordingly, it is an object thereof to provide an analog digital converter, a signal processing system therewith, and an imaging device, which have the advantage of reduced excessive power consumption.

[Means for Solving the Problems]

In order to solve the aforementioned problems, with an analog digital converter according to a first aspect of the present invention for converting an analog signal into a digital signal with predetermined bits, the circuit configuration or the circuit parameter is dynamically adjusted corresponding to the state of the system including the analog digital converter. Examples of "the state of the system" may include: a state which requires high-precision signal processing; a state which does not require high-precision signal processing; and so forth, for example.

With the present aspect, AD conversion is performed with a suitable circuit configuration or a suitable circuit parameter which meets the request of the system. This suppresses excessive power consumption due to performance exceeding that required by the system.

A second aspect of the present invention also relates to an analog digital converter. With the analog digital converter for converting an analog signal into a digital signal with predetermined bits, the conversion bits are dynamically adjusted corresponding to the state of the system including the analog digital converter.

With the present aspect, AD conversion is performed with suitable bits which meet the request of the system. This suppresses excessive power consumption due to AD conversion bits exceeding the request of the system.

A third aspect of the present invention also relates to an analog digital converter. The analog digital converter comprises one or more basic units, each serving as a stage. The analog digital converter comprises at least one basic unit each of which serves as a stage. The basic component includes: an analog digital converter circuit for converting an analog signal input to the stage into a digital value with predetermined bits; a DA converter circuit for converting the output of the analog digital converter circuit into an analog signal; and a subtracter circuit for subtracting the output of the digital analog converter circuit from the input analog signal of the stage or the output analog signal of an amplifier which amplifies the analog signal input to the stage with a predetermined amplification factor. With such a configuration, the basic unit operates one cycle or more for obtaining a digital signal in a predetermined format. Furthermore, the operating frequency is adjusted for at least one of the stages corresponding to the state of the system including the analog digital converter, thereby enabling dynamic adjustment of conversion bits.

An arrangement may be made including one or multiple "stages". Furthermore, with any stage, the output of the stage is fed back to the stage itself so as to operate multiple times for AD conversion. With such an arrangement including a feedback stage, AD conversion bits can be controlled by adjusting the feedback cycles, thereby enabling dynamic adjustment of AD conversion bits while maintaining the circuit area. This allows the user to design an optimum circuit without redundant area regardless of AD conversion bits.

A fourth aspect of the present invention relates to a signal processing system. The signal processing system includes an analog digital converter for converting an analog signal to a digital signal with predetermined bits. Furthermore, the signal processing system also includes a control unit for dynamically controlling the conversion bits of the analog digital converter. With such a configuration, the control unit controls the conversion bits by adjusting the ratio of the operating frequency to the sampling frequency of the analog digital converter. The "control unit" may dynamically control the conversion bits corresponding to the state of the system.

With the present aspect, excessive power consumption of an analog digital converter is reduced, thereby reducing the power consumption of the system as a whole.

An arrangement may be made in which the control unit controls AD conversion bits by adjusting the ratio of the operating frequency to the sampling frequency of the analog digital converter. With such an arrangement, the aforementioned ratio is adjusted for controlling AD conversion bits, thereby enabling circuit design without redundant circuit area. This allows the user to design a circuit with optimum circuit area. Also, an arrangement may be made in which the control unit controls AD conversion bits by performing power-supply control of the circuit components forming the analog digital converter. This reduces power consumption of the analog digital converter.

The control unit may control AD conversion bits from the perspective of gain adjustment. Also, the control unit may control AD conversion bits from the perspective of offset adjustment. Examples of the "gain adjustment" may include gain adjustment for a variable amplifier provided upstream the analog digital converter. On the other hand, examples of the "offset adjustment" may include adjustment of the DC offset component of the analog input signal input to the analog digital converter, such as a received signal or the like converted with the direct conversion method.

The analog digital converter may include a stage in which the output of the stage is fed back to the input thereof. Also, the control unit may have a function of dynamic adjustment of the operating frequency supplied to the stage. With such an arrangement, the feedback cycles of the stage can be controlled with ease by adjusting the operating frequency of the feedback stage, thereby enabling adjustment of conversion bits with ease.

A fifth aspect of the present invention relates to an imaging device. The imaging device comprises: an imaging unit for taking an image of a subject; an amplifier for amplifying an analog signal output from the imaging unit with a predetermined gain; an analog digital converter for converting the analog signal output from the amplifier into a digital signal with predetermined bits; and a control unit for dynamically adjusting the conversion bits of the analog digital converter corresponding to the state of the system. The control unit adjusts the conversion bits from the perspective of gain adjustment for the amplifier.

With the present aspect, excessive power consumption of the analog digital converter is reduced, thereby reducing the power consumption of the imaging device as a whole.

A sixth aspect of the present invention relates to an analog digital converter. With the analog digital converter for converting an analog signal to a digital signal with predetermined bits, current consumption is dynamically adjusted corresponding to the state of the system including the analog digital converter.

With the present aspect, the analog digital converter operates with power consumption which meets the request of the system, thereby suppressing excessive power consumption.

A seventh aspect of the present invention also relates to an analog digital converter. The analog digital converter comprises one or more basic units, each serving as a stage. The basic unit includes: an analog digital converter circuit for converting an analog signal input to the stage into a digital value with predetermined bits; a digital analog converter circuit for converting the output of the analog digital converter circuit into an analog signal; and a subtracter circuit for subtracting the output of the digital analog converter circuit from the input analog signal of the stage or the output analog signal of an amplifier which amplifies the analog signal input to the stage with a predetermined amplification factor. With such a configuration, the basic unit operates one cycle or more for obtaining a digital signal in a predetermined format. Furthermore, the bias current is dynamically adjusted for an amplifier included in any one of the at least one stage corresponding to the state of the system including the analog digital converter.

With the present aspect, the analog digital converter operates with power consumption which meets the request of the system, thereby suppressing excessive power consumption of the analog digital converter such as a pipeline analog digital converter, cyclic analog digital converter, and so forth.

An eighth aspect of the present invention relates to a signal processing system. The signal processing system includes an analog digital converter for converting an analog signal to a digital signal with predetermined bits. Furthermore, the signal processing system includes a control unit for dynamically controlling the current consumption of amplifiers included in the analog digital converter. With such a configuration, the control unit dynamically adjusts the bias voltage applied to transistors operating as current sources within the amplifier according to a detection signal indicating the system state.

With the present aspect, excessive power consumption of the analog digital converter is reduced, thereby reducing the power consumption of the system as a whole.

A ninth aspect of the present invention relates to an analog digital converter. With the analog digital converter for converting an analog signal into a digital signal with predetermined bits, the circuit configuration of an amplifier included in the analog digital converter is dynamically adjusted corresponding to the state of the system including the analog digital converter. The "amplifier" may be formed of a differential amplifier. In this case, an arrangement may be made in which the circuit configuration of the differential amplifier is adjusted by on/off control of transistors included therein.

With the present aspect, the amplifier operates with a suitable circuit configuration which meets the request of the system, thereby suppressing excessive power consumption.

A tenth aspect of the present invention also relates to an analog digital converter. The analog digital converter comprises one or more basic units, each serving as a stage. The basic unit includes: an analog digital converter circuit for converting an analog signal input to the stage into a digital value with predetermined bits; a digital analog converter circuit for converting the output of the analog digital converter circuit into an analog signal; and a subtracter circuit for subtracting the output of the digital analog converter circuit from the input analog signal of the stage or the output analog signal of an amplifier which amplifies the analog signal input to the stage with a predetermined amplification factor. With such a configuration, the basic unit operates one cycle or more for obtaining a digital signal in a predetermined format. Furthermore, the circuit configuration of an amplifier included in any one of the at least one stage is adjusted corresponding to the state of the system including the analog digital converter.

With the present aspect, the amplifier operates with a suitable circuit configuration which meets the request of the system, thereby suppressing excessive power consumption of the analog digital converter such as a pipeline analog digital converter, cyclic analog digital converter, and so forth.

An eleventh aspect of the present invention relates to a signal processing system. The signal processing system includes an analog digital converter for converting an analog signal to a digital signal with predetermined bits. Furthermore, the signal processing system includes a control unit for dynamically adjusting the circuit configuration of an amplifier included in the analog digital converter. With such a configuration, the control unit generates a signal for determining the circuit configuration of the amplifier according to a detection signal indicating the system state.

With the present aspect, excessive power consumption of the analog digital converter is reduced, thereby reducing the power consumption of the system as a whole.

A twelfth aspect of the present invention relates to an analog digital converter. With the analog digital converter for converting an analog signal into a digital signal with predetermined bits, the capacitance of an switched-capacitor amplifier included in the analog digital converter is dynamically adjusted corresponding to the state of the system including the analog digital converter.

With the present aspect, the switched-capacitor amplifier operates with suitable capacitance which meets the request of the system, thereby suppressing excessive power consumption.

A thirteenth aspect of the present invention also relates to an analog digital converter. The analog digital converter comprises one or more basic units, each serving as a stage. The basic unit includes: an analog digital converter circuit for converting an analog signal input to the stage into a digital value with predetermined bits; a digital analog converter circuit for converting the output of the analog digital converter circuit into an analog signal; and a subtracter circuit for subtracting the output of the digital analog converter circuit from the input analog signal of the stage or the output analog signal of an amplifier which amplifies the analog signal input to the stage with a predetermined amplification factor. With such a configuration, the basic unit operates one cycle or more for obtaining a digital signal in a predetermined format. Furthermore, the capacitance of a switched-capacitor amplifier included in any one of the at least one stage is adjusted corresponding to the state of the system including the analog digital converter.

With the present aspect, the switched-capacitor amplifier operates with suitable capacitance which meets the request of the system, thereby suppressing excessive power consumption of the analog digital converter such as a pipeline analog digital converter, cyclic analog digital converter, and so forth.

A fourteenth aspect of the present invention relates to a signal processing system. The signal processing system includes an analog digital converter for converting an analog signal to a digital signal with predetermined bits. Furthermore, the signal processing system includes a control unit for dynamically adjusting the capacitance of a switched-capacitor amplifier included in the analog digital converter. With such a configuration, the control unit generates a signal for determining the capacitance of the switched-capacitor amplifier based upon a detection signal indicating the system state.

With the present aspect, excessive power consumption of the analog digital converter is reduced, thereby reducing the power consumption of the system as a whole.

A fifteenth aspect of the present invention relates to an analog digital converter. With the analog digital converter for converting an analog signal into a digital signal with predetermined bits, the operating frequency is dynamically adjusted corresponding to the state of the system including the analog digital converter.

With the present aspect, the analog digital converter operates with a suitable operating frequency which meets the request of the system, thereby suppressing excessive power consumption.

Note that any combination of the aforementioned components or any manifestation of the present invention realized by modification of a method, system, computer program, recording medium recording a program, and so forth, is effective as an embodiment of the present invention.

DETAILED DESCRIPTION OF THE INVENTION

First Embodiment

Figure 1:
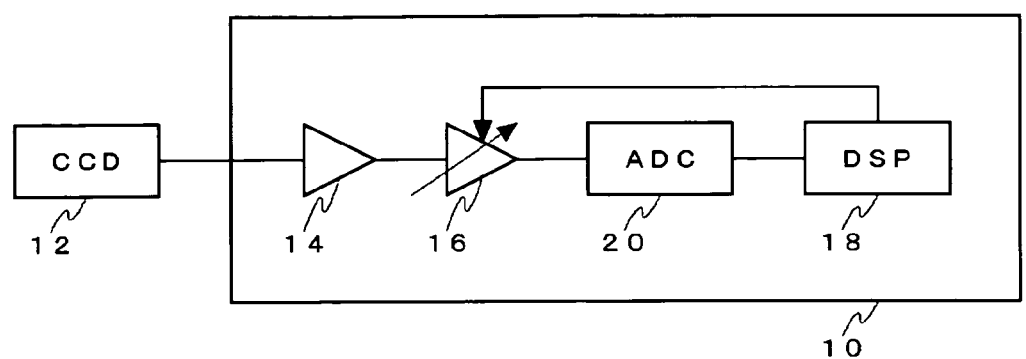
FIG. 1 is a diagram which shows a basic configuration of an ordinary image signal processing system.

A first embodiment is an arrangement in which a signal processing system according to the present invention is applied to image signal processing. FIG. 1 shows a basic configuration of a general image signal processing system. A CCD (Charge Coupled Device) 12 acquires light reflected from the subject, converts the light into electric signals, and outputs the electric signals to a single-chip system LSI 10 having functions for image processing. The System LSI 10 includes built-in component devices of a CDS (Correlated Double Sampling) 14, a variable amplifier 16, an AD converter 20, and a DSP (Digital Signal Processor) 18.

The CDS 14 removes noise by subtracting the signal sampled during reference time from the signal sampled during image-signal acquisition time. The variable amplifier 16 amplifies the output signal from the CDS 14 according to the gain determined by feedback control from the DSP 18. That is to say, the output signal from the CDS 14 is adjusted so as to be within a predetermined range according to the feedback signal from the DSP 18. Specifically, in a case that the CCD 12 receives less light than a predetermined threshold, i.e., in a case of a dark image, the variable amplifier 16 amplifies the output signal by a high gain, in order to handle the small number of electrons from photoelectric conversion as well as handling a situation in which the full scale of the output signals from the CCD 12 is small.

The AD converter 20 converts the output analog signal from the variable amplifier 16 into a digital signal. The AD converter 20 operates with a fixed operating frequency and fixed conversion bits. The DSP 18 performs predetermined digital signal processing such as compression or the like, for the output digital signals from the AD converter 20. Furthermore, the DSP 18 transmits a feedback signal to the variable amplifier 16 corresponding to the light amount received and integrated over time by the CCD 12 so as to control the gain of the variable amplifier 16 as appropriate.

Figure 2:
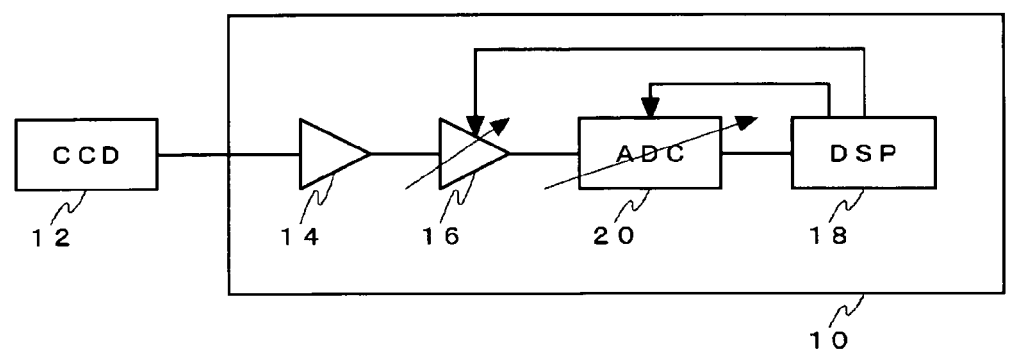
FIG. 2 is a diagram which shows a basic configuration of a signal processing system according to a first embodiment.

FIG. 2 shows a basic configuration of the signal processing system according to the first embodiment. In a case of a dark image as described above, the CCD 12 outputs a small number of electrons through photoelectric conversion. Accordingly, amplification with an excessively high gain by the variable amplifier 16 and AD conversion with an excessively high resolution exceeding the single-electron level by the AD converter 20 are meaningless. Thus, it can be understood that the AD converter 20 with a fixed resolution shown in FIG. 1 performs AD conversion of a dark-image signal with an excessively high resolution.

The system shown in FIG. 2 further has a configuration for dynamically adjusting the resolution, i.e., the conversion bits, of the AD converter 20, in addition to the system shown in FIG. 1. The DSP 18 dynamically controls the conversion bits of the AD converter 20 corresponding to the gain of the variable amplifier 16. Note that the variable amplifier 16 is dynamically controlled by the DSP 18, as well. Specifically, in a case of a high gain of the variable amplifier 16, i.e., in a case that a dark image is input, the DSP 18 controls the AD converter 20 with smaller conversion bits than those of normal operation.

Figure 3:
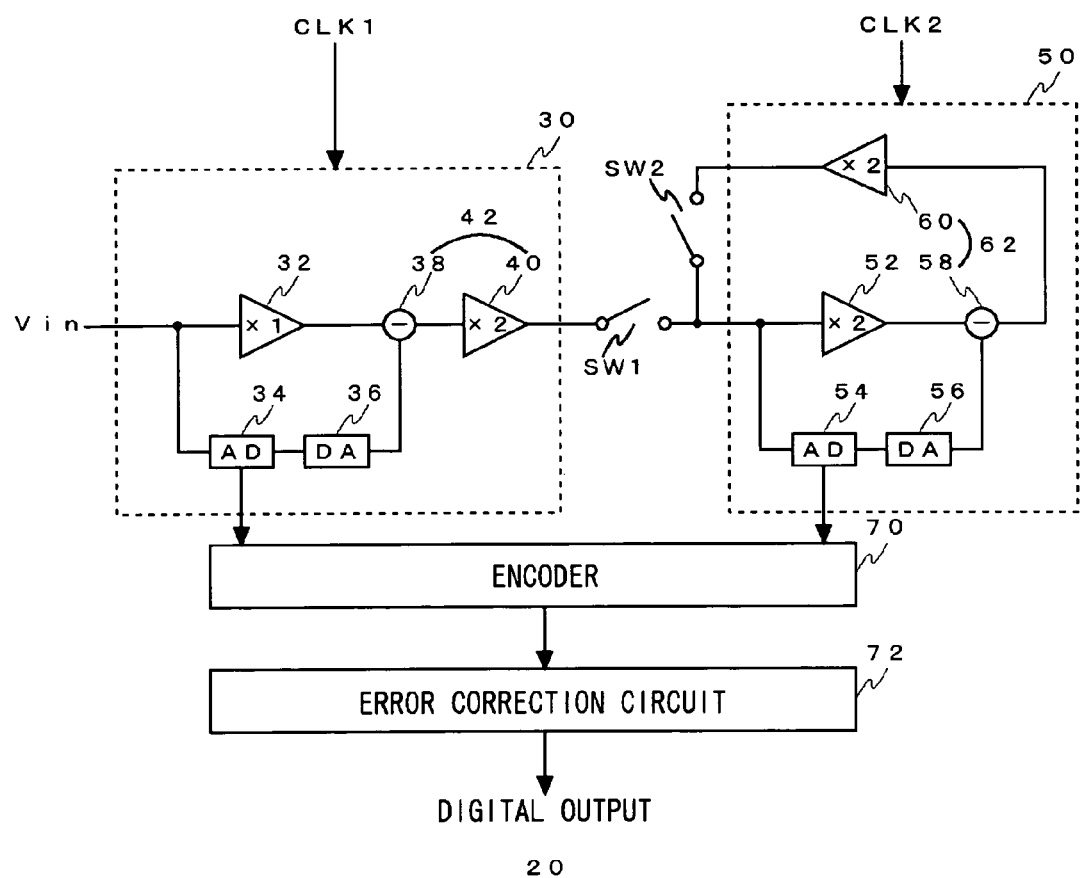
FIG. 3 is a diagram which shows an AD converter according to the first embodiment.

FIG. 3 shows the AD converter 20 according to the first embodiment. With the AD converter 20 according to the first embodiment, a preceding stage 30 of a non-cyclic type performs AD conversion into 4 bits, and a subsequent stage 50 of a cyclic type performs AD conversion into 2 bits each cycle. By allowing the subsequent stage to go through two or three cycles, a total of 8 or 10 bits are output. Note that the operating frequency of the subsequent stage 50 is represented by (sampling frequency×operating cycles). For example, the subsequent stage 50 operating with a sampling frequency 20 MHz and with two operating cycles requires the operating frequency of 40 MHz. In the same way, the subsequent stage 50 operating with three operating cycles requires the operating frequency of 60 MHz.

First, description will be made regarding the preceding stage 30 of the AD converter 20. The input analog signal Vin is input to a first amplifier 32 and a first AD converter 34. Employed as the first AD converter 34 is a flash type AD converter with a resolution, i.e., conversion bits, of 4. The first AD converter 34 converts an input analog signal to a digital signal, and retrieve the higher 4 bits, and outputs the retrieved signal to an encoder 70 and a first DA converter 36. The first DA converter 36 converts the digital value converted by the first AD converter 34 into an analog value. The first amplifier 32 samples and holds the input analog signal for a predetermined period of time, and outputs the signal to a first subtracter 38. The first amplifier 32 is an amplifier with an amplification factor of 1, and serves as a sample and hold circuit. The first subtracter 38 subtracts the output of the first DA converter 36 from the output of the first amplifier 32.

A second amplifier 40 amplifies the output of the first subtracter 38 by an amplification factor of 2. With the AD converter 20, the reference voltage supplied to each comparator of a second AD converter 54 is set to half of that supplied to the comparator of the first AD converter 34. This configuration has the advantage that an amplifier with a reduced factor of 2 can be employed as the second amplifier 40, as opposed to a conventional arrangement in which an amplifier with an amplification factor 4 is employed as the second amplifier 40. Note that an integrated-type first subtraction amplifier 42 may be employed instead of a combination of the first subtracter 38 and the second amplifier 40. This enables a simple circuit configuration.

Next, description will be made regarding the subsequent stage 50. A first switch SW1 and a second switch SW2 are alternately turned on and off. In the state that the first switch SW1 is on, and the second switch SW2 is off, the analog signal input from the preceding stage 30 via the first switch SW1 is input to a third amplifier 52 and a second AD converter 54. Employed as the second AD converter 54 is also a flash type AD converter with a resolution, i.e., conversion bits, of 3 including one redundant bit. The second AD converter 54 converts the input analog signal to a digital value, and outputs the digital value to the encoder 70 and a second DA converter 56. The second DA converter 56 converts the digital value converted by the second AD converter 54 into an analog value.

The third amplifier 52 amplifies the input analog signal by an amplification factor of 2, and outputs the amplified signal to a second subtracter 58. The second subtracter 58 subtracts the output of the second DA converter 56 from the output of the third amplifier 52, and outputs the subtracted signal to a fourth amplifier 60. Note that the second DA converter 56 amplifies the signal essentially by an amplification factor of 2.

Now, description will be made in brief regarding a mechanism of amplification of the second DA converter 56 with an amplification factor of 2. With the present embodiment, a higher reference voltage VRT and a lower reference voltage VRB are supplied to the second AD converter 54 and the second DA converter 56. The second AD converter 54 generates reference voltages using a reference voltage range generated based upon the higher reference voltage VRT and the lower reference voltage VRB. Let us say that a DA converter of the capacitor-array type is employed as the second DA converter 56. In this case, the higher reference voltage VRT or the lower reference voltage VRB is selectively supplied to each of multiple unshown capacitors included in the second DA converter 56 according to the control from the second AD converter 54. As a result, the second DA converter 56 outputs a corresponding output voltage signal. As described above, in general, the reference voltage range of the second DA converter 56 is generated based upon the higher reference voltage VRT and the lower reference voltage VRB. With such a configuration, the ratio of the reference voltage range of the second AD converter 54 to that of the second DA converter 56 should be set to 1:2 for realizing amplification with a factor of 2. For example, an arrangement may be made in which the second AD converter 54 operates with single-ended input of the reference voltage, and the second DA converter 56 operates with differential output, for realizing the aforementioned ratio of 1:2.

The fourth amplifier 60 amplifies the output from the second subtracter 58 by a factor of 2. In this stage, transition is made to the state in which the first switch SW1 is off and the second switch SW2 is on. The analog signal amplified by the fourth amplifier 60 is fed back to the third amplifier 52 and the second AD converter 54 via the second switch SW2. Subsequently, the above processing is repeated. Let us say that the subsequent stage 50 generates two bits besides redundant bits for each cycle. With such a configuration, in a case that the subsequent stage 50 operates two cycles, the subsequent stage outputs a four-bit signal. In the same way, in a case that the subsequent stage 50 operates three cycles, the subsequent stage 50 outputs a six-bit signal. Thus, a total of 8-bit or 10-bit digital signal is output by actions of the preceding stage 30 and the subsequent stage 50.

The encoder 70 receives the output digital value from the first AD converter 34 of the preceding stage 30 and the output digital value from the second AD converter 54 of the subsequent stage 50, separates the redundant bits from these output digital signals, and converts these signals to an 8-bit or 10-bit digital signal. An error correction circuit 72 performs error correction based upon the redundant bits.

Figure 4:
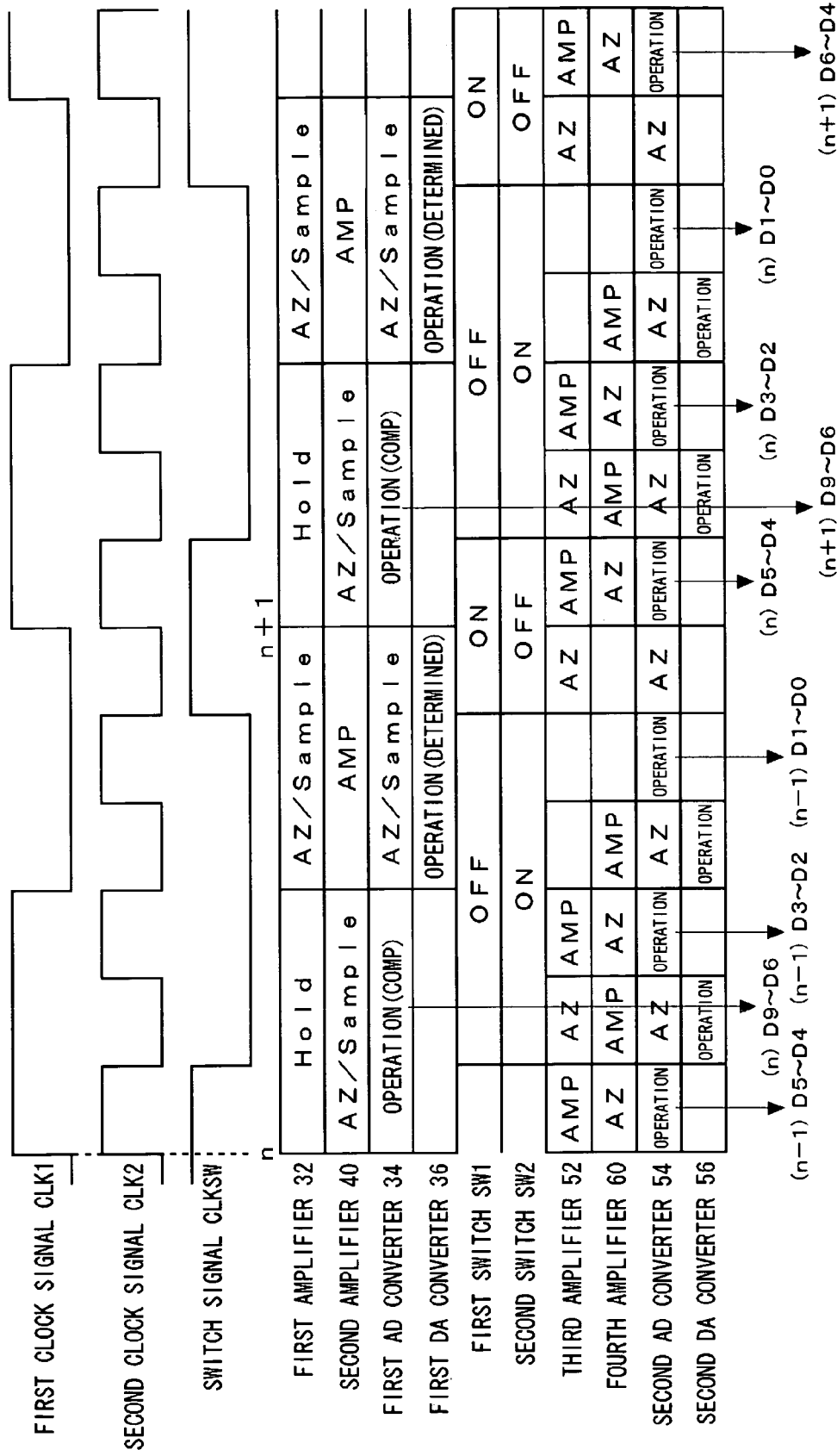
FIG. 4 is a time chart which shows the operation process of the AD converter shown in FIG. 3 for performing conversion into 10 bits.

FIG. 4 is a time chart showing an operation process in which the AD converter 20 shown in FIG. 3 converts an analog signal into a 10-bit digital signal. Now, description will be made in order from the top in the drawing. The three signal waveforms represent a first clock signal CLK1, a second clock signal CLK2, and a switch signal CLKSW, respectively. These clock signals with various frequencies are generated by an unshown divider or multiplier using a base clock signal generated by an unshown timing generator of the system.

The first clock signal CLK1 controls the operations of the first amplifier 32, the second amplifier 40, the first AD converter 34, and the first. DA converter 36. The second clock signal CLK2 controls the operations of the third amplifier 52, the fourth amplifier 60, the second AD converter 54, and the second DA converter 56. The switch signal CLKSW performs on/off control of the first and second switches SW1 and SW2.

The frequency of the second clock signal CLK2 is three times as high as that of the first clock signal CLK1. An arrangement may be made in which the first clock signal CLK1 is generated by dividing the second clock signal CLK2 as a base using a divider. Also, an arrangement may be made in which the second clock signal CLK2 is generated by multiplying the first clock signal CLK1 as a base using a PLL or the like. As described above, the frequency of the second clock signal CLK2 is three times as high as that of the first clock signal CLK1, and accordingly, the subsequent stage 50 operates at a conversion processing speed three times as high as that of the preceding stage 30. The overall conversion precision is greatly dependent upon the precision of analog processing in a conversion step for a higher-bit signal, such as subtraction, amplification, and so forth. Accordingly, the preceding stage 30 for handling the higher-bit signal has need of operation with higher precision. In other words, with the present AD converter 20 having such a configuration, an arrangement may be made in which the subsequent stage 50 operates with low precision as compared with the preceding stage 30. Thus, an arrangement may be made in which the subsequent stage 50 operates at a higher processing speed than that of the preceding stage 30.

Upon detection of the leading edge of the first clock signal CLK1, the first amplifier 32 and the first AD converter 34 sample the input analog signal Vin. The first amplifier 32 holds the sampled analog signal when the first clock signal is Hi, and performs auto-zero operation when the first clock signal CLK1 is Lo. Upon detection of the trailing edge of the first clock signal CLK1, the second amplifier 40 samples the input analog signal. The second amplifier 40 amplifies the sampled analog signal, and outputs the amplified signal to the third amplifier 52 and the second AD converter 54 when the first clock signal CLK1 is Lo, and performs auto-zero operation when the first clock signal CLK1 is Hi. Also, with an arrangement in which the first subtraction amplifier 42 is employed instead of the second amplifier 40, the first subtraction amplifier 42 performs subtraction/amplification processing for the sampled analog signal when the first clock signal CLK1 is Lo. The first AD converter 34 performs conversion operation so as to output digital values D9 through D6 when the first clock signal CLK1 is Hi, and performs auto-zero operation when the first clock signal CLK1 is Lo. The first DA converter 36 holds the converted-and-determined data when the first clock signal CLK1 is Lo, and is in an indeterminate state when the first clock signal CLK1 is Hi.

The first switch SW1 is turned on when the switch signal CLKSW is Hi, and is turned off when the switch signal CLKSW is Lo. The second switch SW2 is turned on when the switch signal CLKSW is Lo, and is turned off when the switch signal CLKSW is Hi.

Upon detection of the leading edge of the second clock signal CLK2, the third amplifier 52 and the second AD converter 54 sample the input analog signal. The third amplifier 52 amplifies the sampled analog signal when the second clock signal CLK2 is Hi, and performs auto-zero operation when the second clock signal CLK2 is Lo. Note that the third amplifier 52 does not perform amplification during a period of time in which the second AD converter 54 performs conversion into the lower bits D1 and D0. Upon detection of the trailing edge of the second clock signal CLK2, the fourth amplifier 60 samples the input analog signal. The fourth amplifier 60 amplifies the sampled analog signal when the second clock signal CLK2 is Lo, and performs auto-zero operation when the second clock signal CLK2 is Hi. With an arrangement in which a second subtraction amplifier 62 is employed instead of the fourth amplifier 60, the second subtraction amplifier 62 performs subtraction/amplification processing for the sampled analog signal when the second clock signal CLK2 is low. Note that the analog signal is not amplified during the subsequent half-clock period after the second AD converter 54 has converted the analog signal into D1 and D0.

The second AD converter 54 performs conversion operation so as to output a 3-bit signal including redundant bits when the second clock signal CLK2 is Hi, and performs auto-zero operation when the second clock signal CLK2 is Lo. The second DA converter 56 holds the converted-and-determined data when the second clock signal CLK2 is Lo, and is in the indeterminate state when the second clock signal CLK2 is Hi. Note that the second DA converter 56 does not perform conversion operation during a period of time in which the second AD converter 54 outputs D1 and D0.

With the first amplifier 32, the second amplifier 40, the third amplifier 52, the fourth amplifier 60, the first AD converter 34, and the second AD converter 54, sampling of the input signal is performed during the auto-zero period. As shown in the drawing, the second AD converter 54 performs conversion processing for D5 and D4, and D3 and D2, while the first AD converter 34 performs conversion processing for the next input analog signal Vin. Such pipeline processing enables the AD converter as a whole to output a 10-bit digital signal each cycle of the first clock signal as a basis.

Figure 5:
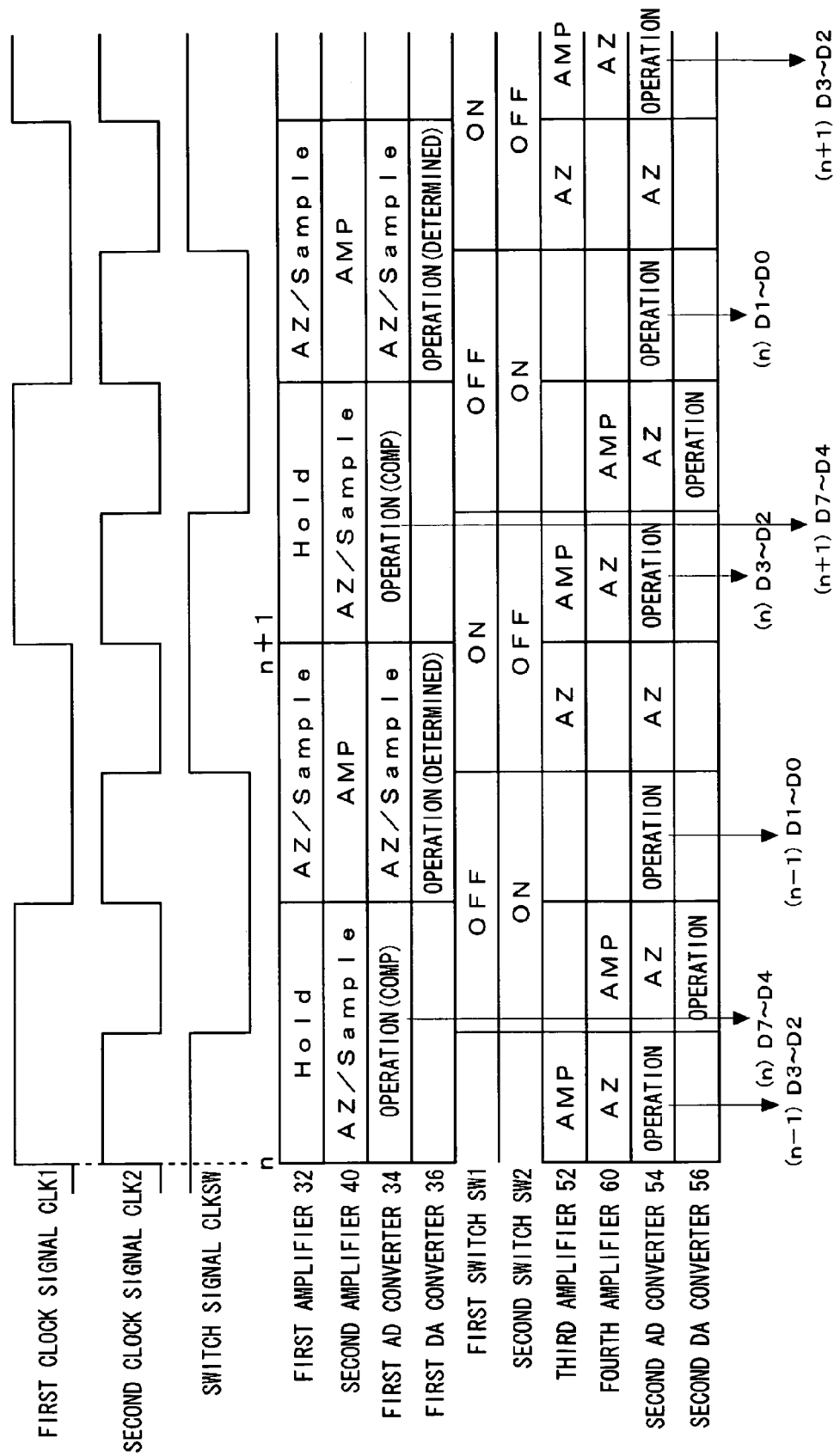
FIG. 5 is a time chart which shows the operation process of the AD converter shown in FIG. 3 for performing conversion into 8 bits.

FIG. 5 is a time chart showing an operation process in which the AD converter 20 shown in FIG. 3 converts an analog signal into an 8-bit digital signal. The frequency of the second clock signal CLK2 is twice the frequency of the first clock signal CLK1. In this case, the frequency of the second clock signal CLK2 is set to ⅔ of the frequency used for conversion into 10 bits. The first clock signal CLK1 and the second clock signal CLK2 for AD conversion into 10 bits are generated by an unshown divider or multiplier.

Each component device operates in generally the same way as described with reference to FIG. 4. The difference therebetween is as follows. That is to say, FIG. 5 shows an arrangement in which the second AD converter 54 performs conversion into the lower four bits of D3 and D2, and D1 and D0, in that order, with two cycles, as opposed to an arrangement shown in FIG. 4, in which the second AD converter 54 performs conversion into the lower six bits of D5 and D4, D3 and D2, and D1 and D0, in that order, with three cycles. As shown in the drawing, the second AD converter 54 performs conversion processing for D3 and D2, while the first AD converter 34 performs conversion processing for the next input analog signal Vin. Such pipeline processing enables the AD converter as a whole to output an 8-bit digital signal each cycle of the first clock signal CLK1 as a basis. Making a comparison between the conversion operation with a 10-bit resolution shown in FIG. 4 and the conversion operation with an 8-bit resolution shown in FIG. 5, it can be understood that an arrangement in which conversion is performed with an 8-bit resolution operates with a lower frequency than with a 10-bit resolution. Accordingly, an arrangement in which conversion is performed with an 8-bit resolution operates with smaller power consumption. Furthermore, an arrangement may be made in which the bias current of each amplifier is controlled correspondingly to the clock frequency for reducing power consumption.

Figure 6:
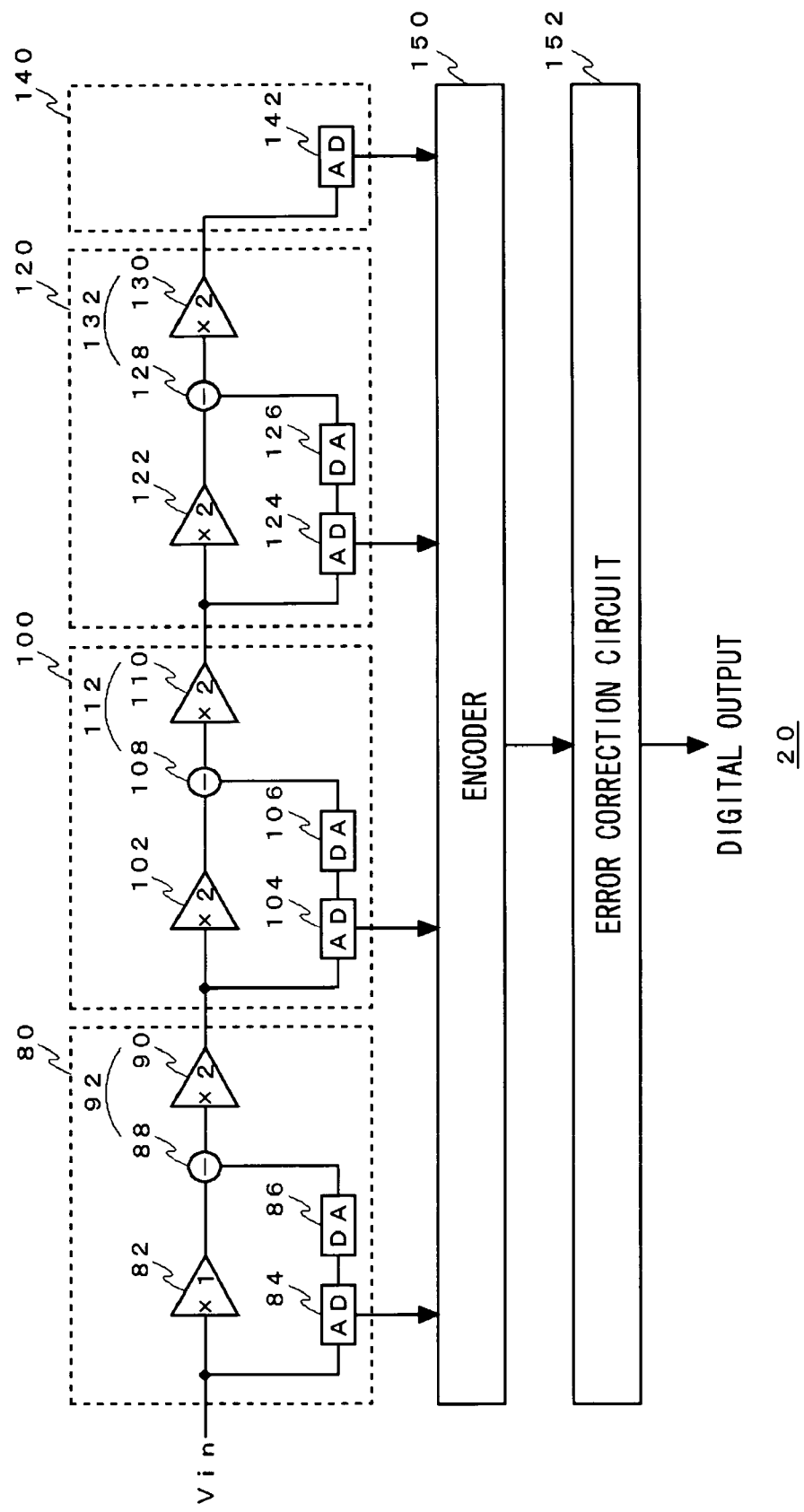
FIG. 6 is a diagram which shows an AD converter according to a second embodiment.

FIG. 6 shows the AD converter 20 according to a second embodiment. Specifically, FIG. 6 shows an arrangement according to the second embodiment, in which a first stage 80 performs conversion into four bits, and a second, third, and fourth stages 100, 120, and 140, each perform conversion into two bits.

The input analog signal Vin is input to a first amplifier 82 and a first AD converter 84. The first amplifier 82 and the first AD converter 84 sample the input signals at the same timing. Employed as the first AD converter 84 is a flash type AD converter with a resolution, i.e., conversion bits, of 4. The first AD converter 84 converts the sampled signal into a digital value, and outputs the higher four bits of the digital signal to an encoder 150 and a first DA converter 86. The first DA converter 86 converts the digital value converted by the first AD converter 84 into an analog value.

The first amplifier 82 holds the sampled signal for a predetermined period of time, and outputs the signal to a first subtracter 88. The first amplifier 82 is an amplifier with an amplification factor of 1, and serves as a sample and hold circuit. The first subtracter 88 subtracts the output analog signal of the first DA converter 86 from the output analog signal of the first amplifier 82. A second amplifier 90 amplifies the output analog signal from the first subtracter 88 by an amplification factor of 2. Note that an integrated-type first subtraction amplifier 92 may be employed instead of a combination of the first subtracter 88 and the second amplifier 90. This enables a reduced circuit area.

The output analog signal from the second amplifier 90 is input to a third amplifier 102 and a second AD converter 104. The third amplifier 102 and the second AD converter 104 sample signals at the same timing. The third amplifier 102 amplifies the sampled signal by an amplification factor of 2, and outputs the amplified signal to a second subtracter 108. The second AD converter 104 converts the sampled signal into a digital value, and outputs the fifth and sixth bits from the highest bit to the encoder 150 and a second DA converter 106.

The second stage 100 performs conversion into two bits. Accordingly, the first stage 80 has need of amplification essentially with a factor of 4 (which is the square of 2). With the first stage 80 according to the present embodiment, the second amplifier 90 performs amplification with a factor of 2. In addition, the reference voltages for the comparators within the second AD converter 104 are set to half of the reference voltages for the first AD converter 84. Such a configuration realizes amplification essentially with a factor of 4.

The second DA converter 106 converts the digital value converted by the second AD converter 104 into an analog value. At this time, the second DA converter 106 performs DA conversion of the output of the second AD converter 104 into an analog signal with an amplification factor of 2. The second subtracter 108 subtracts the output analog signal of the second DA converter 106 from the output analog signal of the third amplifier 102. A fourth amplifier 110 amplifies the output analog signal from the second subtracter 108 by an amplification factor of 2. Note that an integrated-type second subtraction amplifier 112 may be employed instead of a combination of the second subtracter 108 and the fourth amplifier 110. This enables a reduced circuit area.

The output analog signal from the fourth amplifier 110 is input to a fifth amplifier 122 and a third AD converter 124. The fifth amplifier 122 and the third AD converter 124 sample signals at the same timing. The fifth amplifier 122 amplifies the sampled signal by an amplification factor of 2, and outputs the amplified signal to a third subtracter 128. The third AD converter 124 converts the sampled analog signal into a digital value, and outputs the seventh and eighth bits from the highest bit to the encoder 150 and a third DA converter 126.

The third DA converter 126 converts the digital value converted by the third AD converter 124 into an analog value. At this time, the third DA converter 126 performs DA conversion of the output of the third AD converter 124 into an analog signal with an amplification factor of 2. The third subtracter 128 subtracts the output analog signal of the third DA converter 126 from the output analog signal of the fifth amplifier 122. A sixth amplifier 130 amplifies the output analog signal from the third subtracter 128 by an amplification factor of 2. Note that an integrated-type third subtraction amplifier 132 may be employed instead of a combination of the third subtracter 128 and the sixth amplifier 130.

The output analog signal from the sixth amplifier 130 is input to a fourth AD converter 142. The fourth AD converter 142 samples the input analog signal, converts the analog signal into a digital value, and outputs the ninth and tenth bits from the highest bit to the encoder 150.

The encoder 150 receives the output digital values from the first AD converter 84 of the first stage 80, the second AD converter 104 of the second stage 100, the third AD converter 124 of the third stage 120, and the fourth AD converter 142 of the fourth stage 140. The encoder 150 separates the redundant bits from these digital values, and forms an 8-bit or 10-bit digital value. Note that in the mode in which the output digital value is not output from the fourth AD converter 142 of the fourth stage 140, the encoder 140 forms an 8-bit output digital value. An error correction circuit 152 performs error correction based upon the redundant bits.

As described above, the AD converter 20 according to the present embodiment performs AD conversion with 10-bit resolution in the mode in which all the stages are set to active. On the other hand, the AD converter performs AD conversion with an 8-bit resolution in the mode in which only the fourth stage 140 is set to inactive. Note that in the mode in which AD conversion is performed with an 8-bit resolution, there is no need to supply power to the fifth amplifier 122 and the sixth amplifier 130 of the third stage 120 as well as to the fourth stage. Accordingly, the mode in which AD conversion is performed with an 8-bit resolution allows operation with lower power consumption than with a 10-bit resolution.

Figure 7:
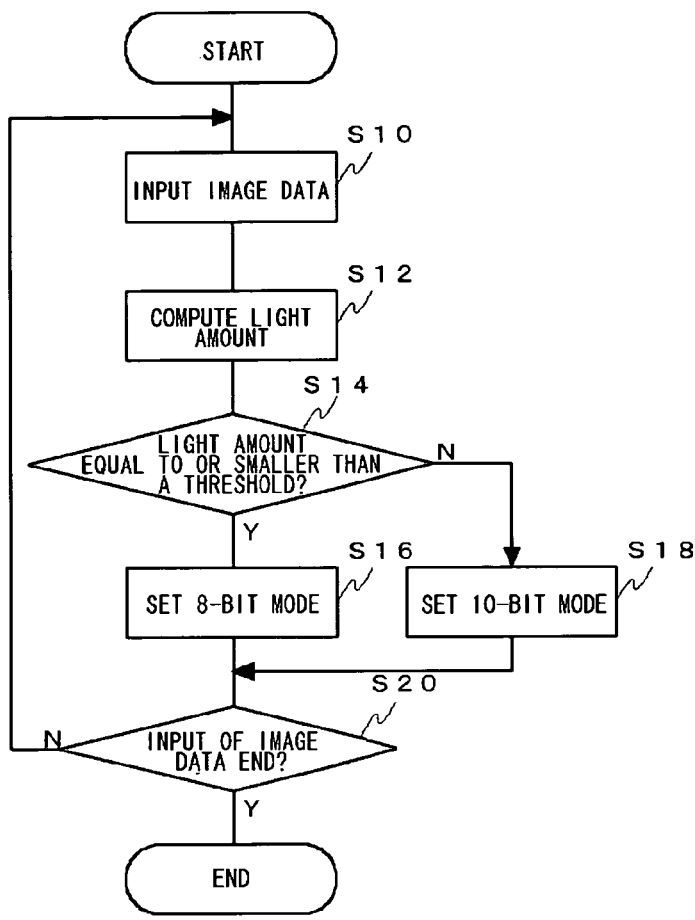
FIG. 7 is a flowchart which shows the operation of the signal processing system according to the first embodiment.

FIG. 7 is a flowchart which shows the operation of the signal processing system according to the first embodiment. The DSP 18 receives digitized image data from the AD converter 20 (S10). The DSP 18 performs time integration of the light amount received by the CCD 12 using the image data (S12). Furthermore, the DSP 18 determines whether or not the light amount is equal to or smaller than a predetermined threshold (S14). In a case that the light amount is equal to or smaller than the threshold (in a case of "YES" in S14), the DSP 18 outputs a control signal so as to operate the AD converter 20 with an 8-bit mode. As a result, the AD converter 20 performs AD conversion into a digital value with a resolution of 8 bits as shown in FIG. 5 (S16).

In a case that the light amount is greater than the threshold (in a case of "NO" in S14), the DSP 18 outputs a control signal so as to operate the AD converter 20 with a 10-bit mode. The AD converter 20 performs AD conversion into a digital value with a resolution of 10 bits as shown in FIG. 4 (S18). Here, the aforementioned threshold is determined from the perspective of the number of generated electrons. Specifically, the threshold should be determined such that analog signals equal to or smaller than the threshold are too low to have need of a resolution of 10 bits. In practice, the optimum threshold should be determined by experiment or simulation. Subsequently, the above processing is repeated as appropriate until input of image data stops (in a case of "YES" in S20). The present invention is not restricted to the arrangement described above, rather, an arrangement may be made in which the conversion bits of the AD converter are controlled corresponding to the gain control signal according to the program processing by the DSP.

Second Embodiment

Figure 8:
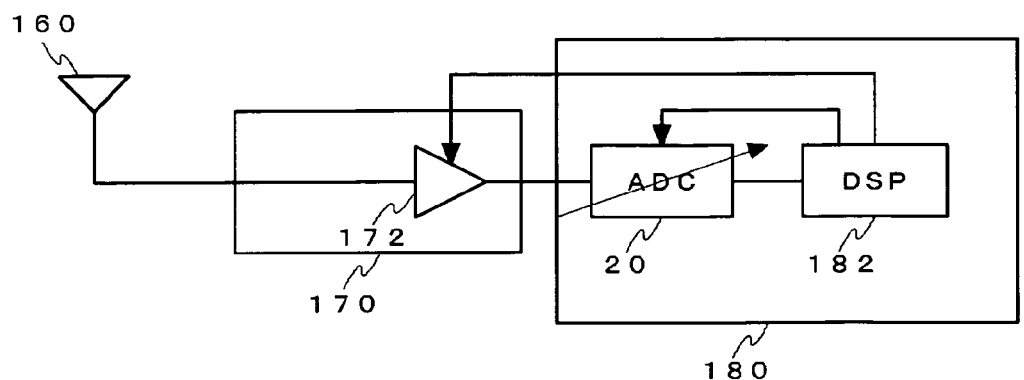
FIG. 8 is a diagram which shows the basic configuration of the signal processing system according to the second embodiment.

In the second embodiment, description will be made regarding an arrangement in which the signal processing system according to the present invention is applied to a communication system. FIG. 8 shows a basic configuration of the signal processing system according to the second embodiment. Let us say that a system for receiving terrestrial digital TV signals is employed as the aforementioned communication system. An antenna 160 receives an RF (Radio Frequency) signal in the UHF band, and outputs the received signal to a tuner IC 170. The tuner IC 170 includes an unshown mixer, and directly converts the RF signal into a base-band signal with the direct conversion method. The tuner IC 170 includes a variable amplifier 172 which allows amplification of the base-band signal corresponding to the gain according to the feedback control from the DSP 182. A system LSI 180 for demodulation includes the AD converter 20 and the DSP 182. The aforementioned base-band signal is input to the AD converter 20. The AD converter 20 performs conversion into a digital value with a resolution of 8 bits or 10 bits, and outputs the digital value to the DSP 182. In general, the DSP 182 performs demodulation, gain control of the variable amplifier 172, and mode switching processing for the AD converter 20 described later.

A direct conversion system has a mechanism in which an RF signal is directly converted into a base-band signal, leading to difficulty in dropping a DC offset component in a stage upstream the AD converter 20 using a capacitor or the like. Accordingly, the AD converter 20 employs redundant bits giving consideration to offset drift. For example, with a system for AD conversion of a received signal into a digital value with a resolution of 8 bits, a range of 10 bits including two redundant bits may be prepared for handling an RF signal including the DC offset component. With such an arrangement, the DSP 182 measures the DC offset component, and drops the unnecessary offset component from the output of the AD converter 20.

Figure 9:
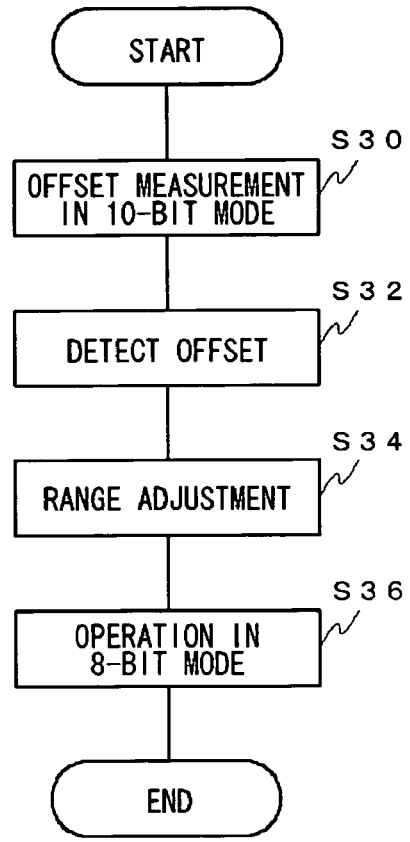
FIG. 9 is a flowchart which shows the operation of the signal processing system according to the second embodiment.

FIG. 9 is a flowchart which shows the operation of the signal processing system according to the second embodiment. The DSP 182 measures the DC offset component in the output signal of the AD converter 20 operating in the 10-bit mode, and determines the necessary range of the AD converter 20 (S30). Note that the AD converter 20 is controlled so as to operate in the 10-bit mode during DC offset measurement. Next, upon detection of the DC offset component (S32), the DSP 182 adjusts the 8-bit conversion range so as to accommodate the received signal including the DC offset component (S34). Then, the DSP 182 outputs a control signal to the AD converter 20 for AD conversion in the 8-bit mode. As a result, transition is made to the state in which the AD converter 20 operates in the 8-bit mode, i.e., the normal mode (S36). While the DSP 182 performs offset measurement in the initial stage, an arrangement may be made in which the DSP 182 performs offset measurement every predetermined period of time during operation giving consideration to change in the receiving environment. In this case, the AD converter 20 operates in the 10-bit mode during the offset measurement.

Figure 10:
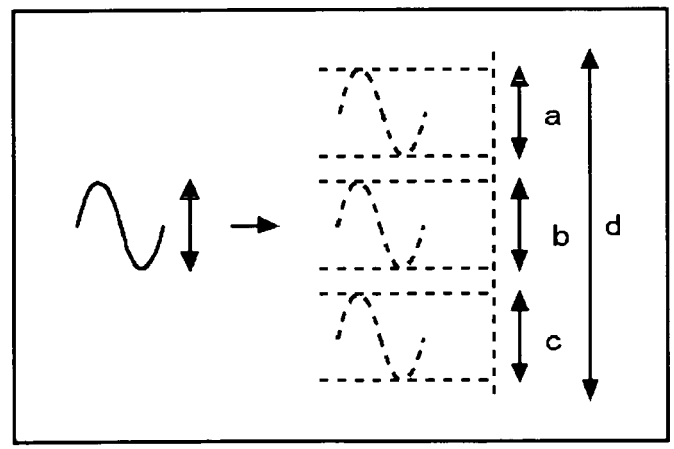
FIG. 10 is a diagram which shows an example of range adjustment for the AD converter.

FIG. 10 shows an example of range adjustment for the AD converter 20. In FIG. 10, three ranges a through c each represent 8-bit conversion ranges. The range d which is four times these three ranges represents a 10-bit conversion range for offset measurement. The DSP 182 measures the offset component of the output signal in the offset measurement range, and selects a suitable range from the aforementioned three ranges a through c based upon the measurement results. Upon selection of the suitable 8-bit range, the AD converter 20 operates in the 8-bit conversion mode, i.e., the normal mode.

Now, description will be made regarding a method for adjusting the range of the AD converter 20. The DSP 182 controls the reference voltage range supplied to the first AD converter 34 and the second AD converter 52 shown in FIG. 3. Specifically, the DSP 182 controls the reference voltage range thereof such that the reference voltage in the 8-bit mode is ¼ of that in the 10-bit mode. For example, an arrangement may be made in which the DSP 182 performs control such as reduction of the higher reference voltage VRT or the like. More specifically, an arrangement may be made in which the higher reference voltage and the lower reference voltage are switched between by actions of a switch and a built-in resistor array provided for generating the reference voltage range, for example.

As described above, with the second embodiment, the AD converter 20 performs offset measurement with conversion bits including certain redundant bits. Following offset adjustment, the AD converter 20 operates with conversion bits including no redundant bits. This reduces power consumption of the AD converter 20.

Description has been made regarding the AD converter 20 which allows dynamic adjustment of the conversion bits according to the state of the signal processing system. Next, description will be made regarding the AD converter 20 which allows dynamic adjustment of at least one of a circuit parameter other than the conversion bits and the circuit configuration, according to the state of the signal processing system.

Figure 11:
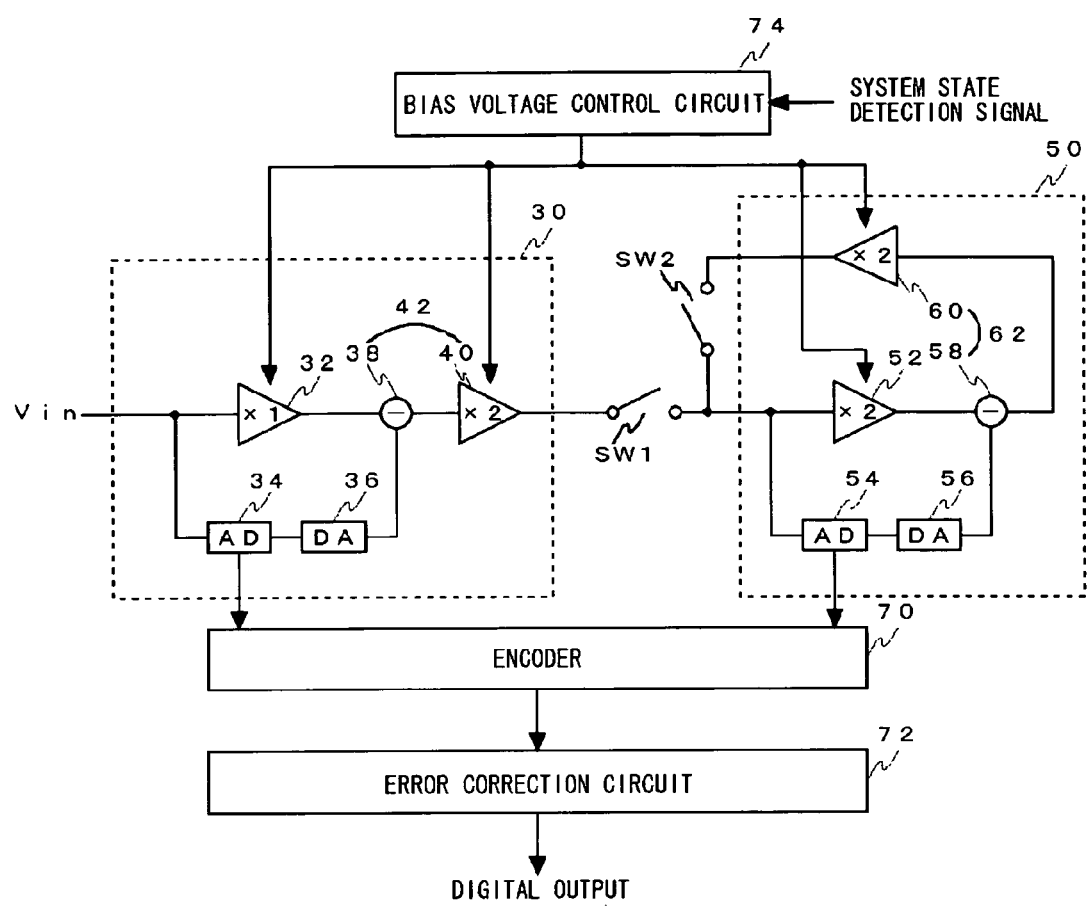
FIG. 11 is a diagram which shows an AD converter according to a third embodiment.

First, description will be made regarding the AD converter 20 for realizing a function which allows dynamic adjustment of the consumption current. FIG. 11 shows the AD converter 20 according to a third embodiment. The AD converter 20 according to the third embodiment has generally the same configuration and operation as the AD converter 20 according to the first embodiment shown in FIG. 3. Note that the configuration which allows dynamic adjustment of the conversion bits is not essential to the third embodiment, and accordingly, the AD converter 20 according to the third embodiment may or may not have such a configuration.

The AD converter 20 according to the third embodiment further includes a bias voltage control circuit 74 in addition to the configuration of the first embodiment. The bias voltage control circuit 74 adjusts the bias voltages supplied to the first amplifier 32, the second amplifier 40, the third amplifier 52, and the fourth amplifier 60, according to a predetermined system state detection signal. The system state detection signal is a signal corresponding to detection results of the system state. For example, the system state detection signal indicates the degree of signal-processing precision required by the system. In a case that determination has been made that the system does not requires high precision based upon the received system state detection signal, the bias voltage control circuit 74 reduces at least one of the bias voltages supplied to the amplifiers 32, 42, 52, and 60, thereby reducing corresponding bias current. That is to say, in a case that the system does not require high precision, there is no need of settling of the output value for a long time. Accordingly, an arrangement may be made in which the bias current is reduced in such a case, thereby reducing power consumption.

Figure 12:
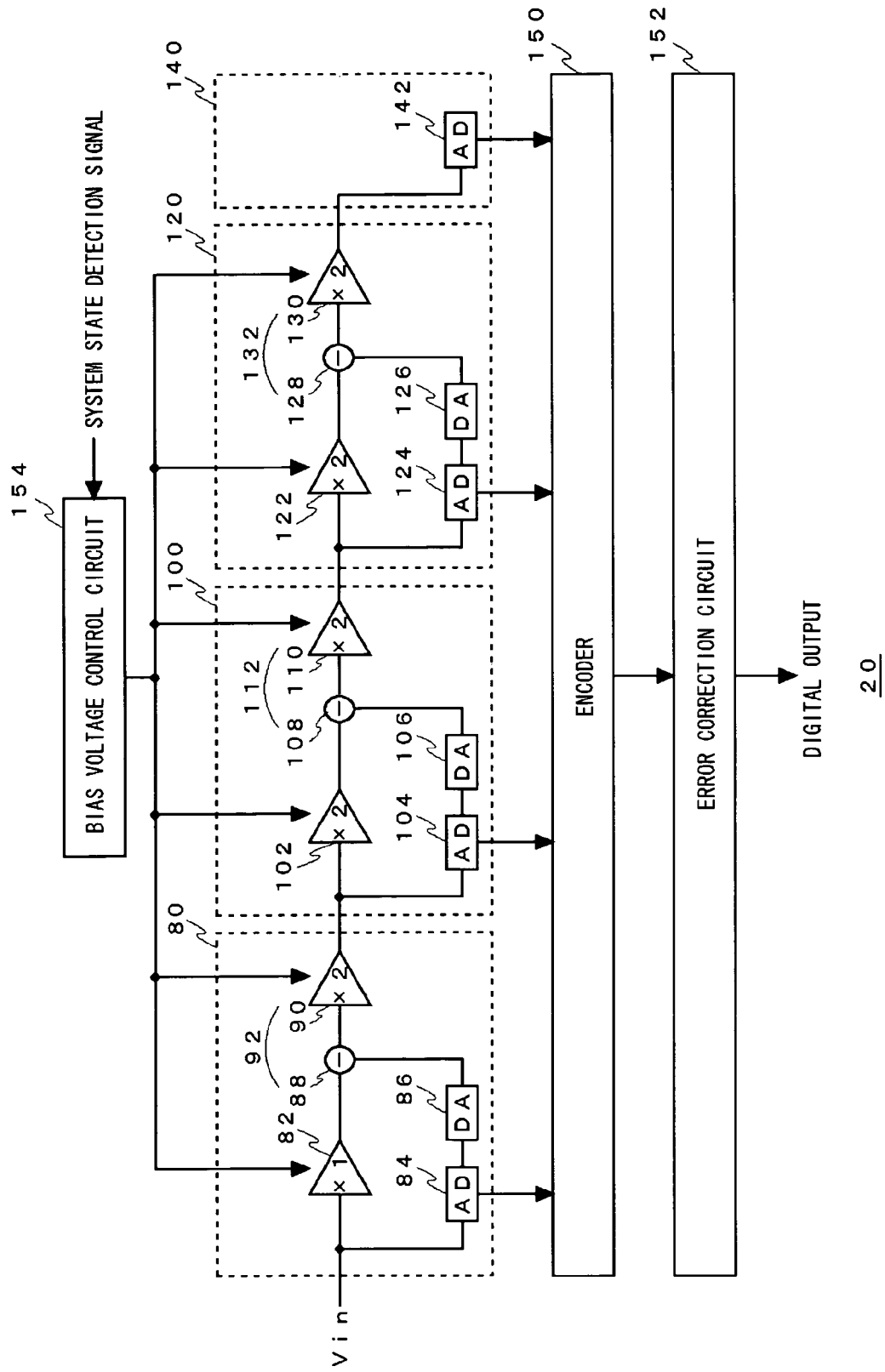
FIG. 12 is a diagram which shows an AD converter according to a fourth embodiment.

FIG. 12 shows the AD converter 20 according to a fourth embodiment. The configuration and the operation of the AD converter 20 according to the fourth embodiment are essentially the same as those of the AD converter 20 according to the second embodiment shown in FIG. 6. The AD converter 20 according to the fourth embodiment further includes a bias voltage control circuit 154 in addition to the configuration of the second embodiment shown in FIG. 6. The bias voltage control circuit 154 adjusts the bias voltages supplied to the first amplifier 82, the second amplifier 90, the third amplifier 102, the fourth amplifier 110, the fifth amplifier 122, and the sixth amplifier 160, according to a predetermined system state detection signal.

Figure 13:
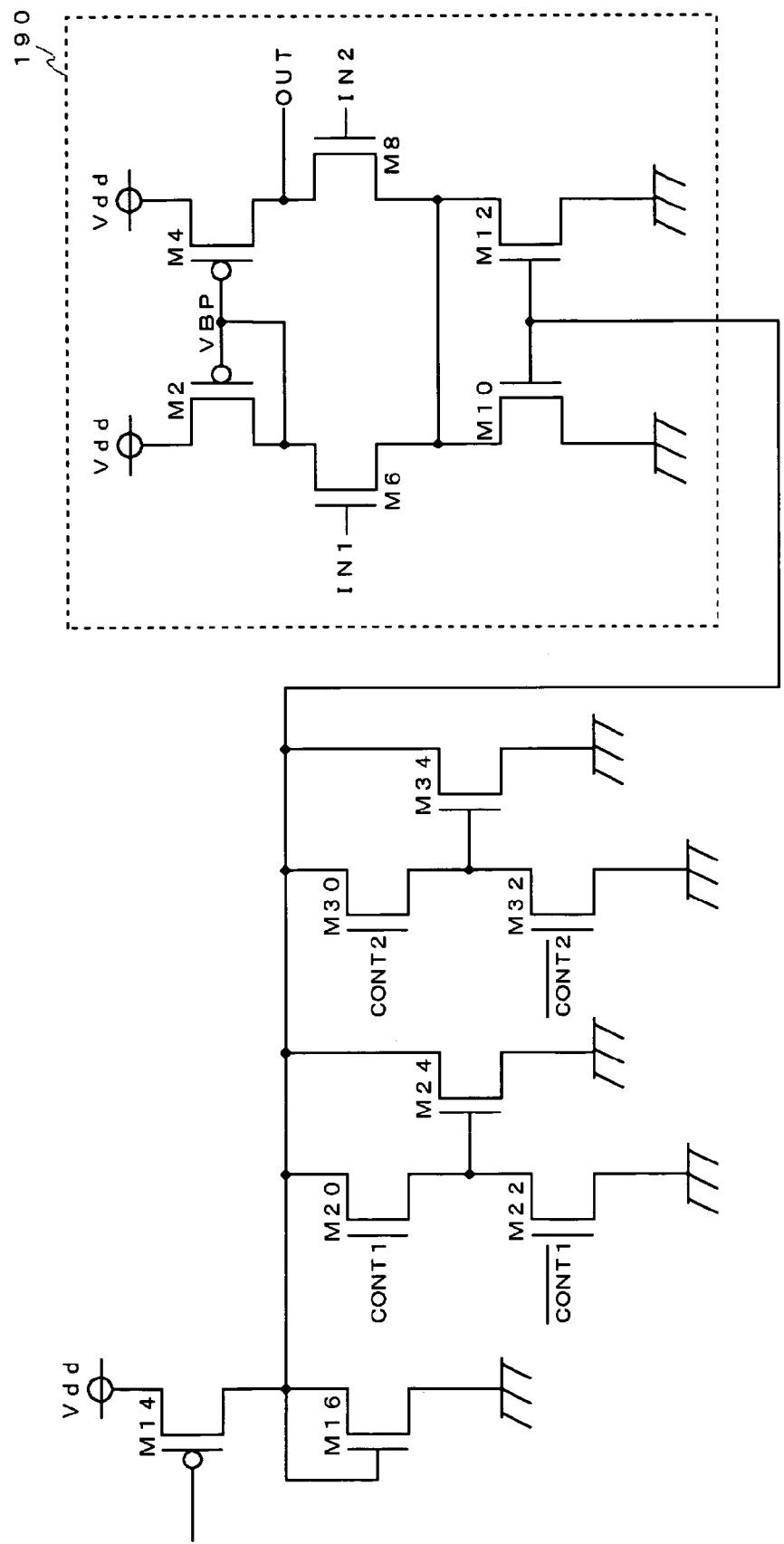
FIG. 13 is a diagram which shows a first example of a circuit configuration allowing adjustment of the bias current of an amplifier.

FIG. 13 shows an example of a circuit configuration which allows adjustment of the bias current supplied to an amplifier. The circuit configuration includes: an operational amplifier 190 and a bias voltage generating circuit for supplying a bias voltage to a constant current source of the operational amplifier 190. Note that the aforementioned bias voltage generating circuit forms a part of the aforementioned bias voltage control circuit 74 or 154.

The operational amplifier 190 includes: a pair of P-channel MOS (Metal-oxide Semiconductor) field effect transistors (which will be referred to as "PMOS transistors" hereafter) M2 and M4, and a pair of N-channel MOS field effect transistors (which will be referred to as "NMOS transistors" hereafter) M6 and M8, and another pair of NMOS transistors M10 and M12.

With the pair of the PMOS transistors M2 and M4, the supply voltage Vdd is supplied to the drain electrodes thereof, and a predetermined bias voltage is supplied to the gate electrodes thereof. The pair of the PMOS transistors forms a current mirror circuit, and accordingly, drain currents flowing in both the source electrodes are identical. With the pair of the NMOS transistors M6 and M8, the drain electrodes are connected to the aforementioned current mirror circuit, and the source electrodes are connected to the constant current source. Differential inputs IN1 and IN2 are supplied to the gate electrodes thereof. Furthermore, the node between the PMOS transistor M4 and the NMOS transistor M8 serves as the output OUT. Note that the pair of the NMOS transistors M10 and M12 forms the constant current source. A bias voltage is supplied from the aforementioned bias voltage generating circuit to the common gate electrode of the pair of the NMOS transistors M10 and M12.

The bias voltage generating circuit includes a PMOS transistor M14 and an NMOS transistor M16 connected in series between the supply voltage Vdd and the ground level. Furthermore, the drain electrode of the NMOS transistor M16 is connected to the gate electrode thereof. The PMOS transistor M14 has a function serving as a constant current source. Note that a controlled voltage is applied to the gate electrode of the PMOS transistor M14 so as to serve a constant current source. The voltage at the node between the PMOS transistor M14 and the NMOS transistor M16 is used as a bias voltage applied to the gate electrodes of the pair of the NMOS transistors M10 and M12 having a function serving as a constant current source of the operational amplifier 190.

The circuit configuration shown in FIG. 13 has a configuration described below, in addition to the aforementioned basic configuration. A predetermined number of NMOS transistors, e.g., M24 and M34 are connected between: the node between the PMOS transistor M14 and the NMOS transistor M16; and the ground level, in parallel to the NMOS transistor M16. A series circuit of two NMOS transistors M20 and M22 serving as a push-pull circuit is provided between the aforementioned node and the ground level in order to control the NMOS transistor M24. Furthermore, the gate electrode of the NMOS transistor M24 is connected to the node between these two NMOS transistors M20 and M22. Note that an identical series circuit of two NMOS transistors is provided to each of the other NMOS transistors connected in parallel to the NMOS transistor M16.

These three NMOS transistors M20, M22, and M24, form a block. A predetermined number of the blocks are provided.

An arrangement shown in FIG. 13 includes two blocks. The bias control signal CONT1 and the inverse signal thereof are input to the gate electrodes of the two NMOS transistors M20 and M22, respectively, having a function serving as a push-pull circuit.

The NMOS transistor M16 and the predetermined number of NMOS transistors M24 and M34 connected in parallel to the NMOS transistor M16 operate in the saturation region, and a constant current is input from the PMOS transistor M14 to each of the drain electrodes thereof. An unshown control unit of the bias voltage control circuit 74 or 154 supplies the aforementioned bias control signals CONT1 and CONT2 to the blocks such that each of the predetermined number of NMOS transistors M24 and M34 serves as a switch between the gate terminal and the drain terminal thereof. Thus, the control unit controls the number of the active blocks. Such a configuration allows dynamic adjustment of the voltage at the node between the aforementioned PMOS transistor M14 and the NMOS transistor M16. This voltage serves as a bias voltage applied to the common gate electrode of the NMOS transistors M10 and M12 which operate as a constant current source within the amplifier included in the AD converter 20. Thus, such a configuration allows dynamic adjustment of the bias current of the amplifier.

Figure 14:
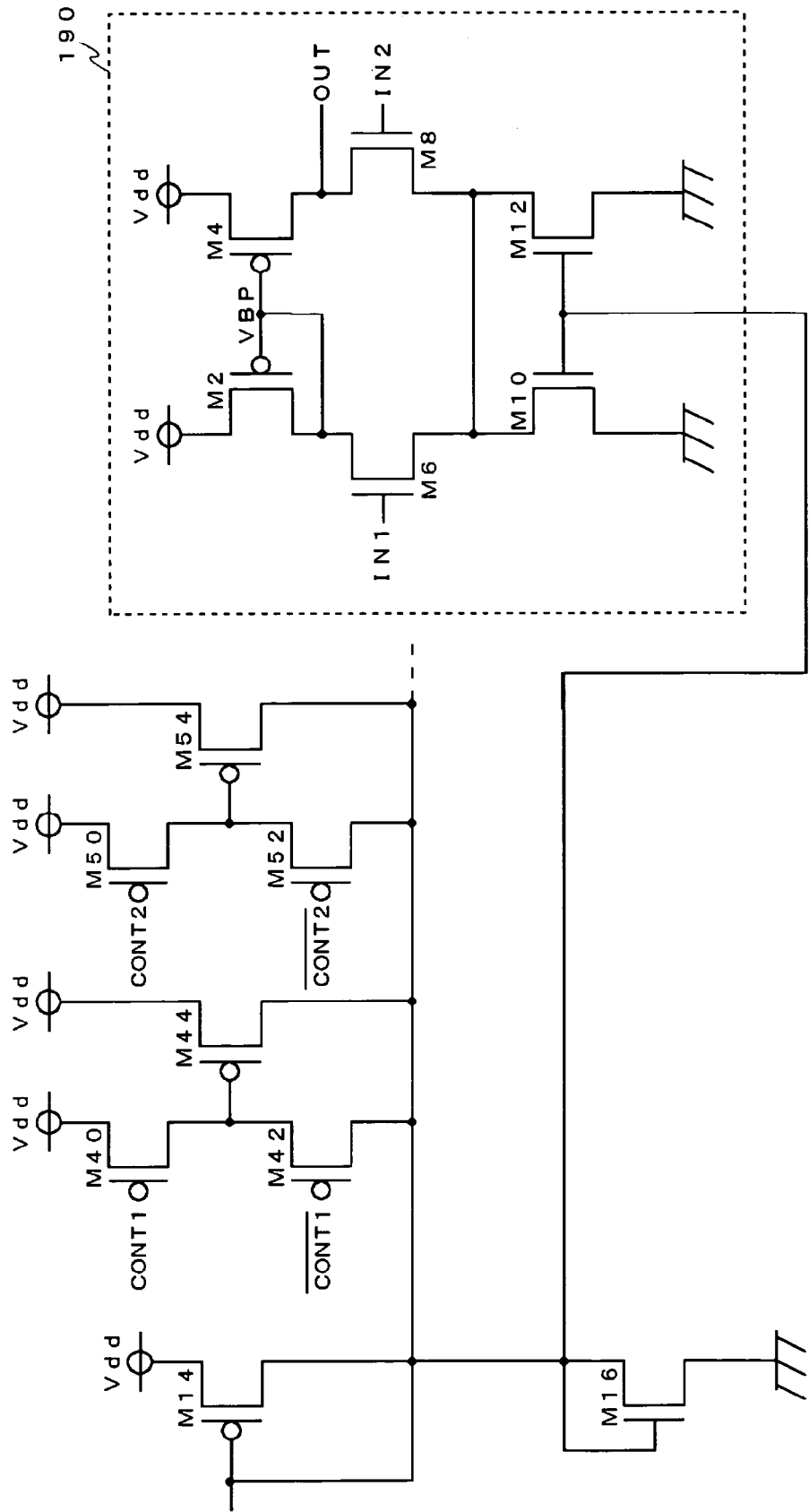
FIG. 14 is a diagram which shows a second example of a circuit configuration allowing adjustment of the bias current of an amplifier.

FIG. 14 shows a second example of a circuit configuration which allows adjustment of the bias current of an amplifier. This circuit configuration includes the operational amplifier 190 and a series circuit of the PMOS transistor M14 and the NMOS transistor M16 for supplying a bias voltage to the operational amplifier 190 in the same way as in the first example described above. With the second example, a predetermined number of PMOS transistors, e.g., M44 and M54 are provided in parallel to the PMOS transistor M14. Note that the drain electrodes of the PMOS transistors M44 and M54 are connected to the supply voltage Vdd. The predetermined number of PMOS transistors, e.g., M44 and M54 serve as constant current sources, as well.

In order to control the PMOS transistor M44, a series circuit of two NMOS transistors M40 and M42 serving as a push-pull circuit is provided between: the supply voltage VDD; and the node between the PMOS transistor M14 and the NMOS transistor M16. Furthermore, the node between the two NMOS transistors M40 and M42 is connected to the gate electrode of the PMOS transistor M44. The same can be said of the other PMOS transistors provided in parallel to the PMOS transistor M14.

A total of three transistors; the PMOS transistor M44, and the two NMOS transistors M40 and M42, form one block. The second example of the circuit configuration includes a predetermined number of the blocks. The bias control signal CONT1 and the inverse signal thereof are input to the gate electrodes of the two NMOS transistors M40 and M42 serving as a push-pull circuit, respectively.

An unshown control unit of the bias voltage control circuit 74 or 154 supplies the aforementioned bias control signals, e.g., CONT1 and CONT2, to the aforementioned blocks for controlling the predetermined number of PMOS transistors, e.g., M44 and M54, thereby enabling adjustment of the number of the PMOS transistors which operate as constant current sources used as the reference of the present bias voltage generating circuit. This allows dynamic adjustment of the voltage at the node between the aforementioned PMOS transistor M14 and the NMOS transistor M16. Thus, such a configuration allows adjustment of the bias current of an amplifier included in the AD converter 20.

Figure 15:
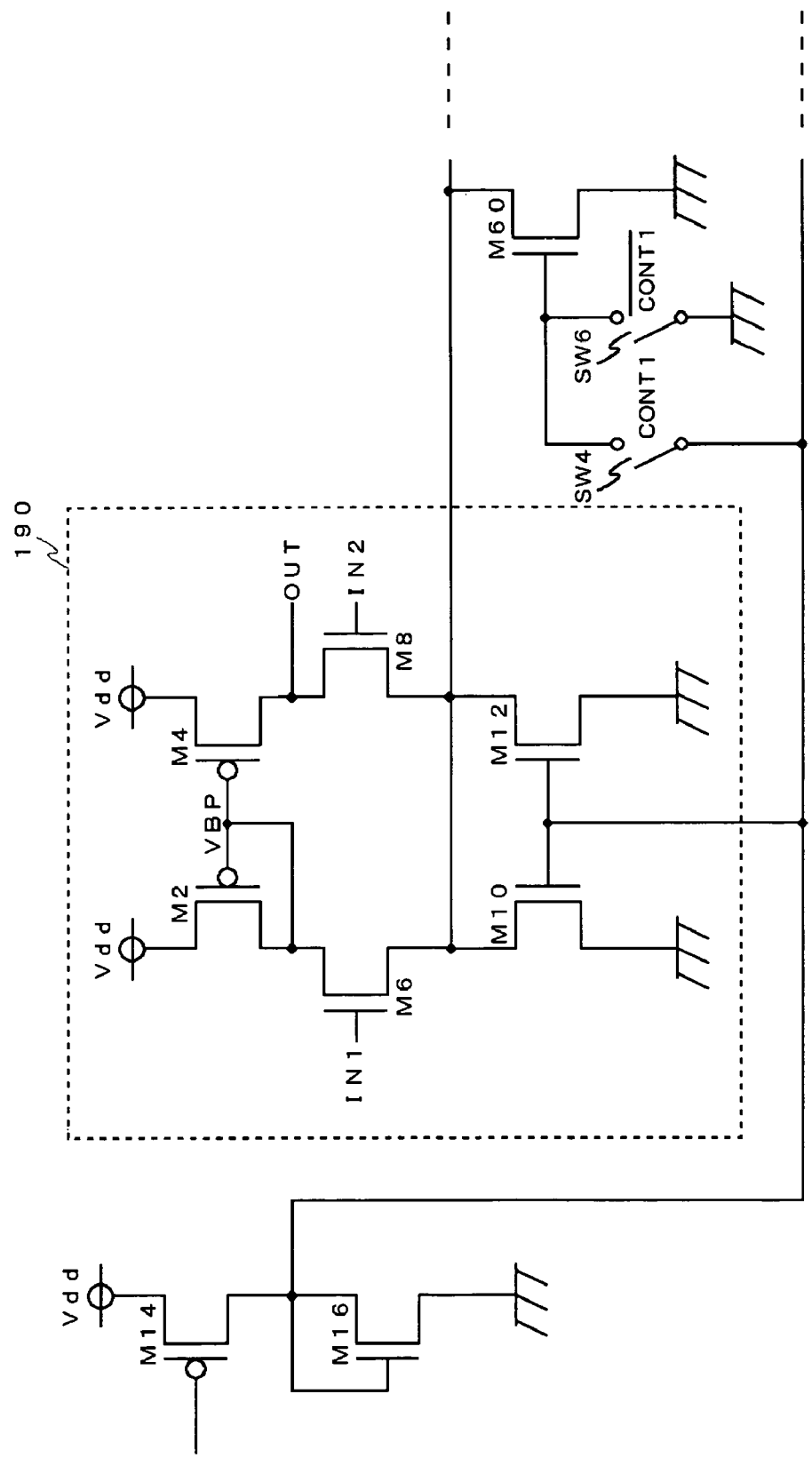
FIG. 15 is a diagram which shows a third example of a circuit configuration allowing adjustment of the bias current of an amplifier.

FIG. 15 shows a third example of a circuit configuration which allows adjustment of the bias current of an amplifier. This circuit configuration includes the operational amplifier 190 and a series circuit of the PMOS transistor M14 and the NMOS transistor M16 for supplying a bias voltage to the operational amplifier 190 essentially in the same way as in the first example described above. The third example has no configuration which allows adjustment of the bias voltage applied to the gate electrodes of the NMOS transistors M12 and M14 serving as a constant current source of the operational amplifier 190, but has a configuration which allows adjustment of the number of constant current sources within the operational amplifier 190.

With the third example, a predetermined number of constant current sources are provided between: the common source of a pair of the NMOS transistors M6 and M8 which receives the differential inputs IN1 and IN2; and the ground level. Each constant current source may be formed of an NMOS transistor, e.g., an NMOS transistor M60. In order to control the NMOS transistor M60, a switch SW4 is provided for on/off control of the aforementioned bias voltage to the gate electrode. Furthermore, a switch SW6 is provided for on/off control of the ground level to the gate electrode. With the present example, the circuit configuration performs on/off control of the switches SW4 and SW6 using the bias control signal CONT1 and the inverse signal thereof such that a suitable one of these switches SW4 and SW6 is turned on and the other is turned off. The NMOS transistor M60 and the pair of the switches SW4 and SW6 form one block. Note that a predetermined number of blocks, each of which has such a configuration, are provided.

An unshown control unit of the bias voltage control circuit 74 or 154 supplies the aforementioned bias control signals, e.g., CONT1 and CONT2, to the aforementioned blocks for controlling the predetermined number of PMOS transistors, e.g., M60, thereby enabling adjustment of the number of the PMOS transistors which operate as constant current sources. This allows dynamic adjustment of the current applied from the constant current sources to the differential amplifier which is a component of the AD converter 20. Thus, such a configuration enables adjustment of bias current of an amplifier included within the AD converter 20.

Figure 16:
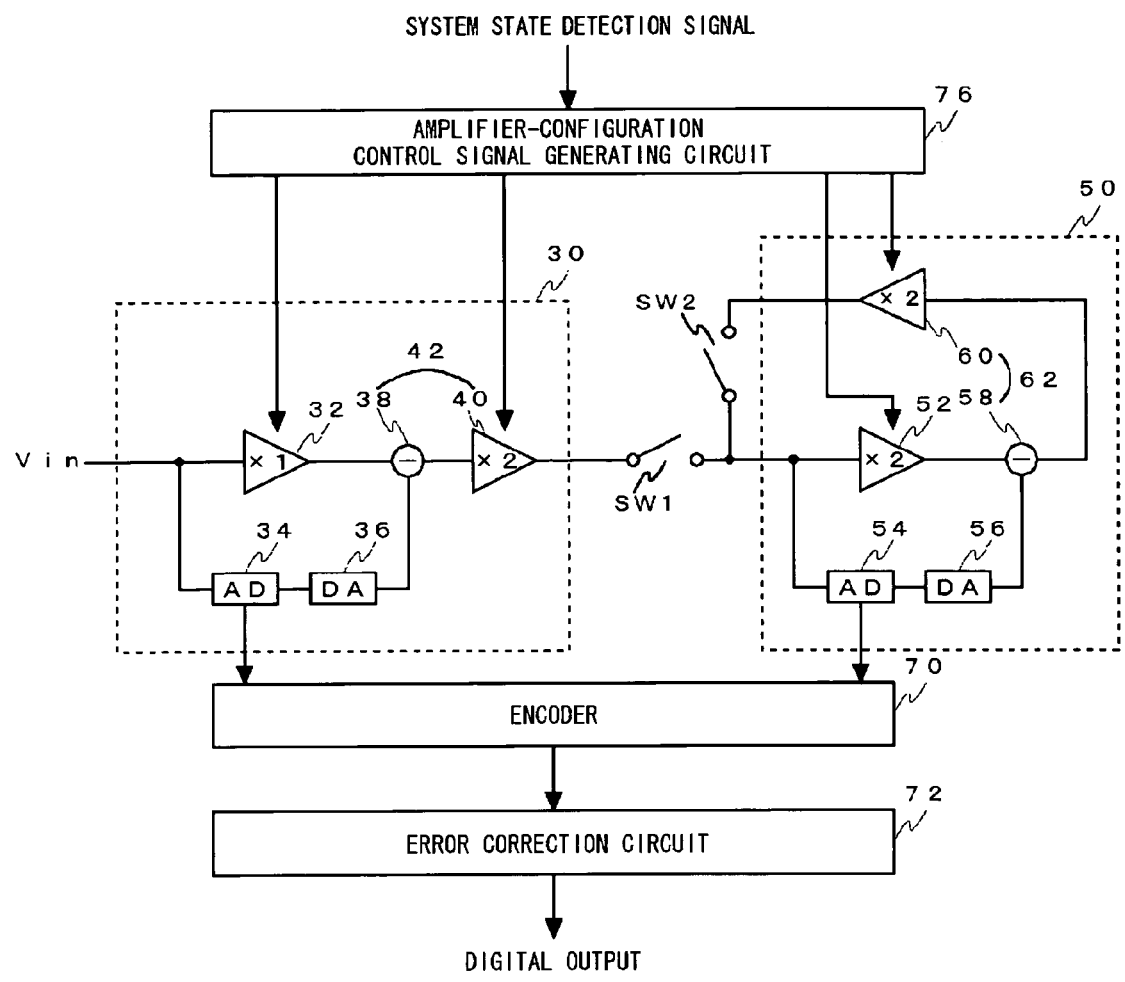
FIG. 16 is a diagram which shows an AD converter according to a fifth embodiment.

Next, description will be made regarding the AD converter 20 having a configuration which allows dynamic adjustment of the circuit configuration of an amplifier. FIG. 16 shows the AD converter 20 according to a fifth embodiment. The configuration and operation of the AD converter 20 according to the fifth embodiment are essentially the same as with the AD converter 20 according to the first embodiment shown in FIG. 3.

The AD converter 20 according to the fifth embodiment has a configuration further including an amplifier-configuration control signal generating circuit 76, in addition to the configuration according to the first embodiment. The amplifier-configuration control signal generating circuit 76 outputs an amplifier-configuration control signal to at least one of the first amplifier 32, the second amplifier 40, the third amplifier 52, and the fourth amplifier 60, according to a predetermined system state detection signal. The amplifier-configuration control signal is a signal for adjusting the circuit configuration of the amplifier. Description will be made later regarding an example of adjustment of the circuit configuration.

Figure 17:
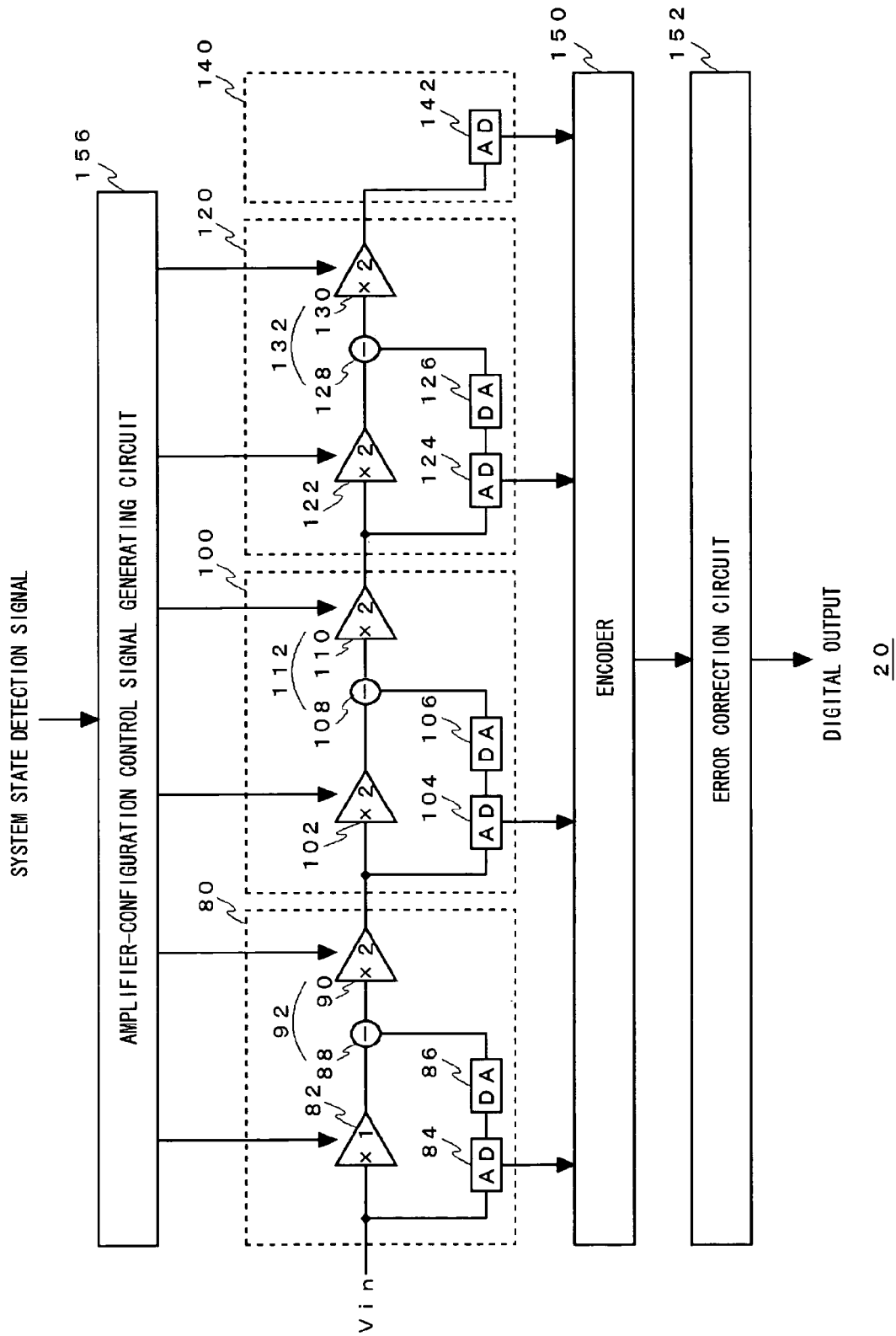
FIG. 17 is a diagram which shows an AD converter according to a sixth embodiment.

FIG. 17 shows the AD converter 20 according to a sixth embodiment. The configuration and operation of the AD converter 20 according to the sixth embodiment are essentially the same as with the AD converter 20 according to the second embodiment shown in FIG. 6. The AD converter 20 according to the sixth embodiment has a configuration further including an amplifier-configuration control signal generating circuit 156, in addition to the configuration according to the second embodiment. The amplifier-configuration control signal generating circuit 156 outputs an amplifier-configuration control signal to at least one of the first amplifier 82, the second amplifier 90, the third amplifier 102, the fourth amplifier 110, the fifth amplifier 122, and the sixth amplifier 130, according to a predetermined system-state detection signal.

Figure 18:
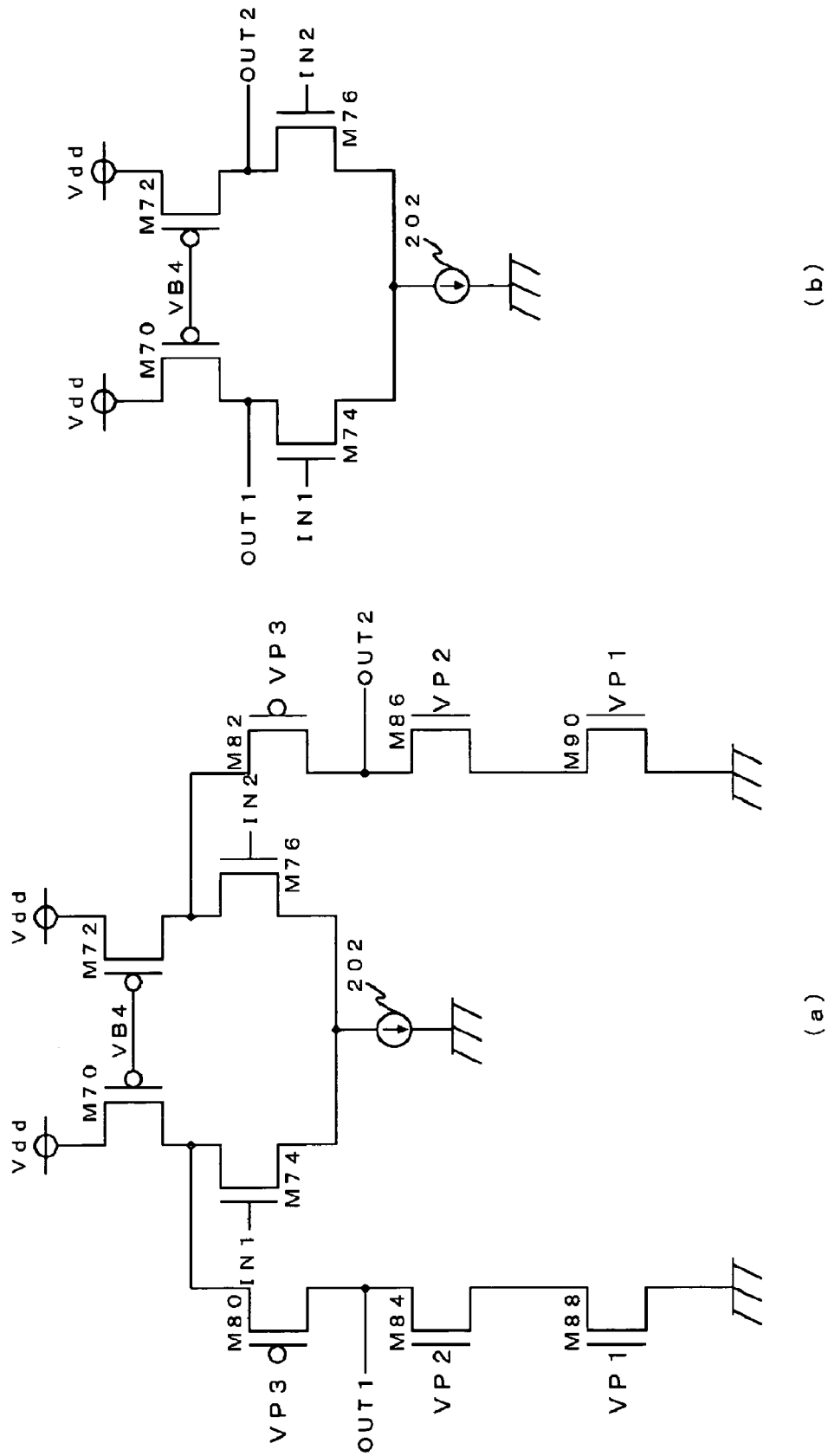
FIG. 18 is a diagram which shows an example allowing adjustment of the circuit configuration of an amplifier.

FIG. 18 shows an example which allows adjustment of the circuit configuration of an amplifier. The present example employs a fully-differential amplifier. FIG. 18A shows the configuration of folded-cascode differential amplifier, and FIG. 18B shows the configuration of an ordinary differential amplifier. First, description will be made regarding a common circuit configuration shown in FIG. 18B. The aforementioned differential amplifier includes a pair of PMOS transistors M70 and M72, a pair of NMOS transistors M74 and M76, and a constant current source 202.

With the pair of the PMOS transistors M70 and M72, the supply voltage Vdd is supplied to the drain electrodes thereof, and a predetermined bias voltage VB4 is supplied to the gate electrodes thereof. The drain electrodes of the NMOS transistors M74 and M76 forming a pair are connected to the source electrodes of the PMOS transistors M70 and M72 forming a pair. Furthermore, the source electrodes of the NMOS transistors M74 and M76 are connected to the constant current source 202. The differential inputs IN1 and IN2 are supplied to the gate electrodes of the NMOS transistors M74 and M76. With such a configuration, one of the differential outputs OUT1 is obtained from the node between the PMOS transistor M70 which is one PMOS transistor of the PMOS-transistor pair and the NMOS transistor M74 which is one NMOS transistor of the NMOS-transistor pair. Also, the other one of the differential outputs OUT2 is obtained from the node between the PMOS transistor M72 which is the other PMOS transistor of the PMOS-transistor pair and the NMOS transistor M76 which is the other NMOS transistor of the NMOS-transistor pair.

Next, description will be made regarding a circuit configuration further including folded-cascode circuits shown in FIG. 18A. A folded-cascode circuit formed of three transistors of a PMOS transistor M80 and NMOS transistors M84 and M88 is connected to one of the aforementioned nodes. Also, another folded-cascode circuit formed of three transistors of a PMOS transistor M82 and NMOS transistors M86 and M90 is connected to the other one of the aforementioned nodes. A predetermined bias voltage VB3 is applied to the gate electrodes of the PMOS transistors M80 and M82 forming a pair. Furthermore, a predetermined bias voltage VB2 is applied to the gate electrodes of the NMOS transistors M84 and M86 forming a pair. Furthermore, a predetermined bias voltage VB1 is applied to the gate electrodes of the NMOS transistors M88 and M90 forming a pair. With such a configuration, the differential outputs OUT1 and OUT2 are obtained from the drain electrodes of the NMOS transistors M84 and M96 forming a pair.

An unshown control unit of the amplifier-configuration control signal generating circuit 76 or 156 controls the bias voltage VB3 applied to the gate electrodes of the PMOS transistors M80 and M82 forming a pair, so as to switch between the configuration of the ordinary differential amplifier and the configuration of the folded-cascode differential circuit. Specifically, upon increasing the gate voltage applied to the gate electrodes of the PMOS transistors M80 and M82 forming a pair up to the supply voltage level VDD, the circuit configuration operates as an ordinary differential amplifier.

Also, various types of amplifiers may be employed, such as a two-stage amplifier further including a driving circuit in addition to a differential amplifier, or a telescopic amplifier. It can be easily understood that a combination of such an amplifier and a suitable switch allows switching of the circuit configuration with ease.

Such an amplifier which allows dynamic adjustment of the circuit configuration thereof enables an application as follows. For example, in a case that the system requires high precision, there is the need of operating the amplifier with a high DC gain, and accordingly, the folded cascode differential amplifier is used. Note that the folded cascode differential amplifier has the disadvantage of small current efficiency for high operating frequencies. In a case that the system does not require high precision due to the situation of the system, an ordinary differential amplifier is preferably employed instead of the folded cascode differential amplifier, from the perspective of the current efficiency. Such an ordinary differential amplifier operates with lower current consumption. Thus, such an arrangement allows dynamic adjustment of the circuit configuration of an amplifier included in the AD converter 20, thereby enabling adjustment of the current consumption of the amplifier according to system requests. Thus, such an arrangement has the advantage of operating with reduced current consumption as compared with an arrangement having a fixed circuit configuration.

Figure 19:
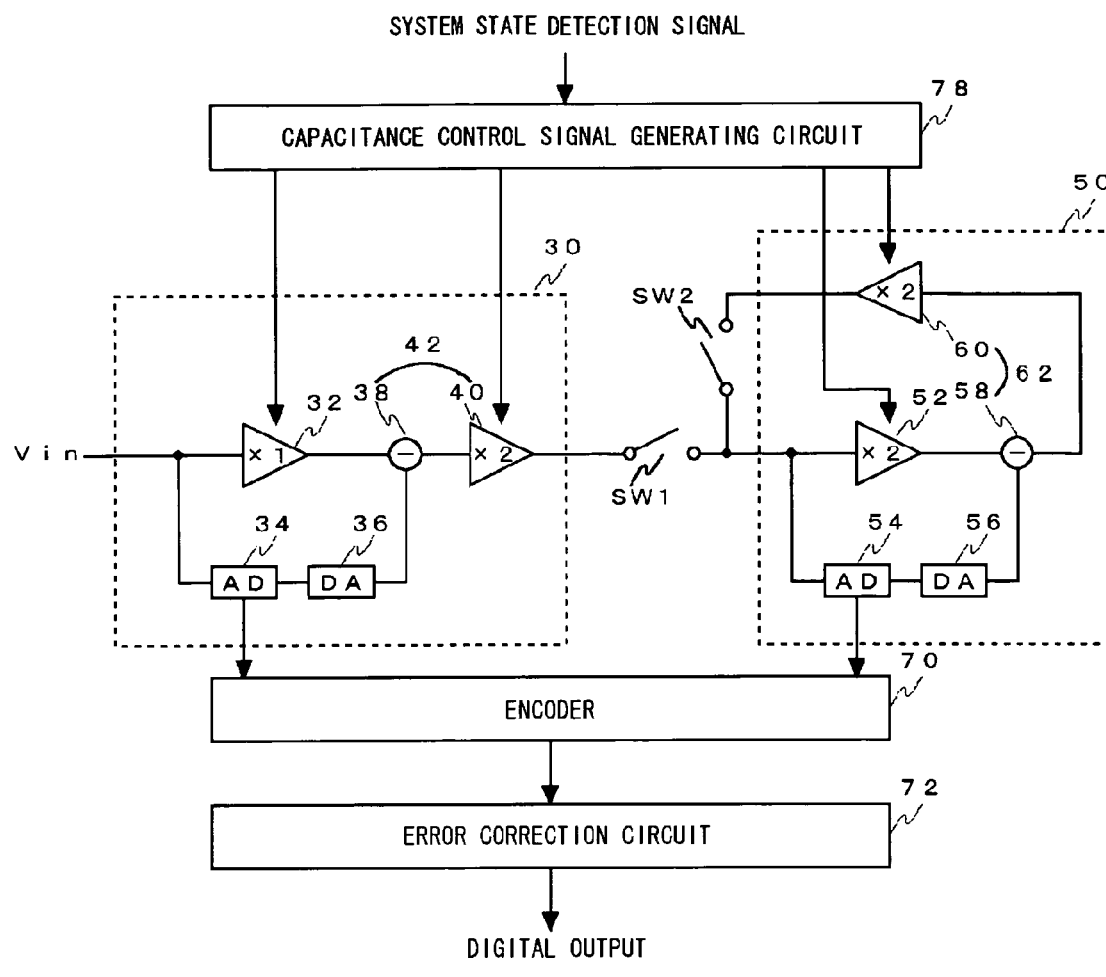
FIG. 19 is a diagram which shows an AD converter according to a seventh embodiment.

Next, description will be made regarding the AD converter 20 for realizing a function which allows dynamic adjustment of the capacitance within an amplifier. FIG. 19 shows the AD converter 20 according to a seventh embodiment. The configuration and operation of the AD converter 20 according to the seventh embodiment are essentially the same as with the AD converter 20 according to the first embodiment shown in FIG. 3.

The AD converter 20 has a configuration further including a capacitance control signal generating circuit 78 in addition to the configuration according to the first embodiment. The capacitance control signal generating circuit 78 outputs a capacitance control signal to at least one of the first amplifier 32, the second amplifier 40, the third amplifier 52, and the fourth amplifier 60, according to a predetermined system state detection signal. The capacitance control signal is a signal for adjusting the capacitance of the amplifier. Description will be made later regarding an example of the circuit configuration for realizing this function.

Figure 20:
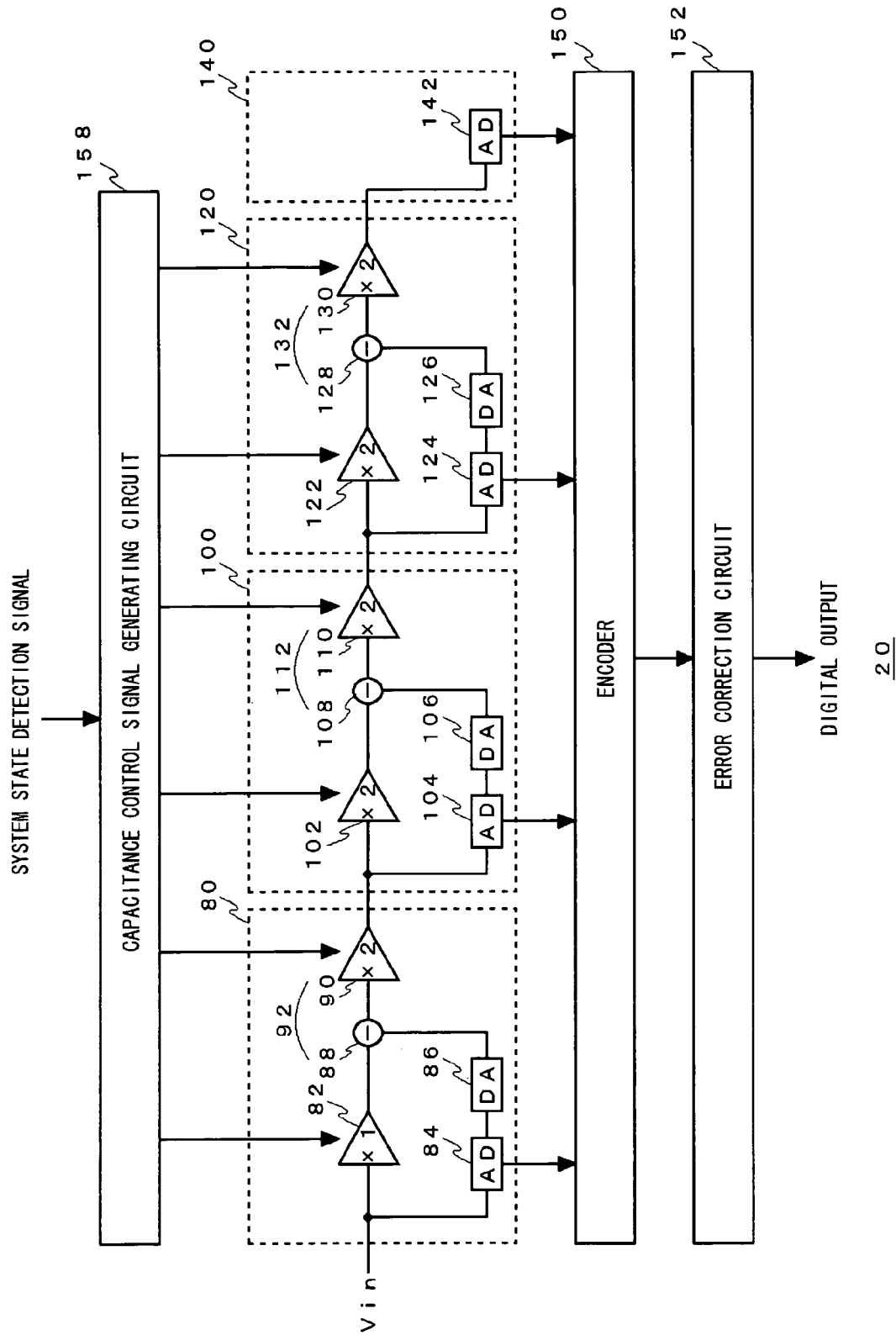
FIG. 20 is a diagram which shows an AD converter according to an eighth embodiment.

FIG. 20 shows the AD converter 20 according to an eighth embodiment. The configuration and operation of the AD converter 20 according to the eighth embodiment are essentially the same as with the AD converter 20 according to the second embodiment shown in FIG. 8. The AD converter 20 according to the eighth embodiment has a configuration further including a capacitance control signal generating circuit 158 in addition to the configuration of the second embodiment. The capacitance control signal generating circuit 158 outputs a capacitance control signal to at least one of the first amplifier 82, the second amplifier 90, the third amplifier 102, the fourth amplifier 110, the fifth amplifier 122, and the sixth amplifier 130, according to a predetermined system state detection signal.

Figure 21:
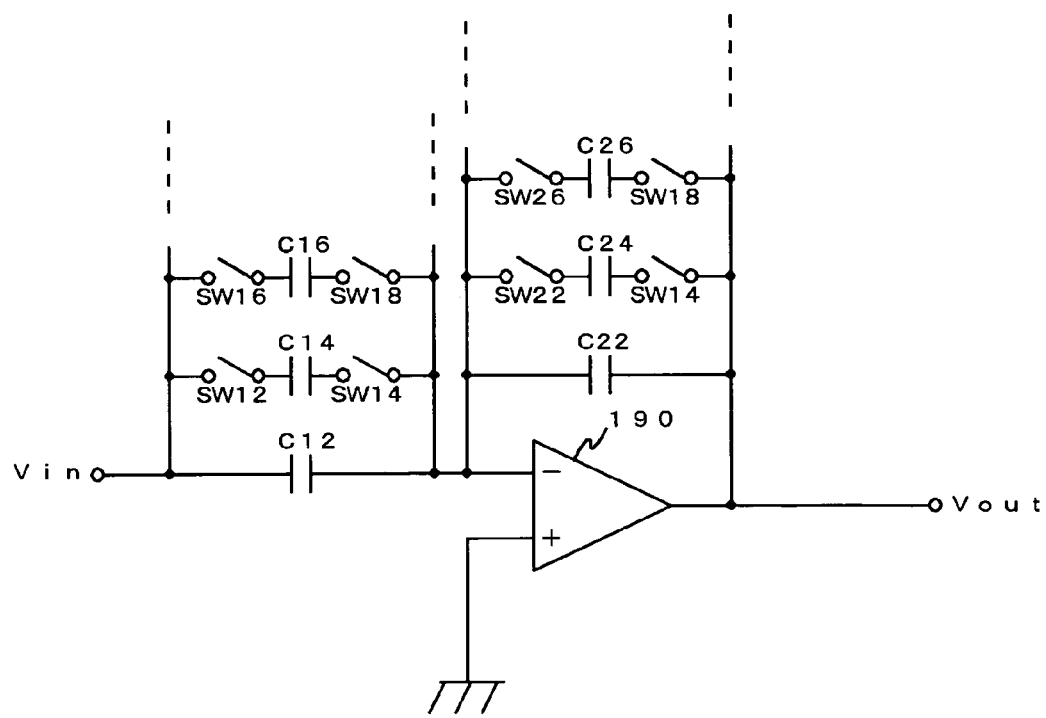
FIG. 21 is a diagram which shows an example allowing adjustment of the capacitance of an amplifier.

FIG. 21 shows an arrangement which allows adjustment of the capacitance of an amplifier. With the present arrangement, a switched-capacitor amplifier is employed. The inverting input terminal of the operational amplifier 190 is connected to an input capacitor C12 for receiving the input voltage Vin. Furthermore, a predetermined number of input capacitors, e.g., C14 and C16, are provided between the inverting input terminal of the operational amplifier 190 and the input terminal of the overall amplifier, in parallel to the input capacitor C12. These capacitors are controlled regarding whether or not each capacitor serves as a component of the total capacitance, by actions of switches such as SW12, SW14, SW16, and SW18. Note that these switches SW12, SW14, SW16, and SW18, are subjected to on/off control according to a predetermined control signal.

On the other hand, the non-inverting input terminal of the operational amplifier 190 is connected to the ground level. The output terminal and the inverting input terminal of the operational amplifier 190 are connected via a feedback capacitor C22. Furthermore, a predetermined number of feedback capacitors, e.g., C24 and C26, are provided in parallel to the feedback capacitor C22. These capacitors are controlled with regard to whether or not each capacitor serves as a component of the total capacitance, by actions of switches such as SW22, SW24, SW26, and SW28. These switches, e.g., the SW22, SW24, SW26, and SW26, are subjected to on/off control according to a predetermined control signal. The switched capacitor amplifier having such a configuration enables control of amplification of the input voltage Vin by adjusting the ratio of the input capacitance to the feedback capacitance.

An unshown control unit of the amplifier-configuration control signal generating circuit 78 or 158 controls the aforementioned switches so as to adjust the number of the active capacitors electrically connected to the amplifier. Such a configuration allows dynamic adjustment of at least one of the input capacitance and the feedback capacitance.

In a case that the system requires high precision, the amplifier must operates with small sampling noise. The sampling noise of the switched capacitor amplifier is dependent upon the square root of (kT/C). Accordingly, in this case, the capacitance of the amplifier is preferably large. Note that the constant k represents Boltzmann's constant, the variable T represents the absolute temperature, and the variable C represents the capacitance. However, a cyclic AD converter or a pipeline AD converter includes multiple amplifiers connected in series. With such an amplifier, increased capacitance of each amplifier leads to increased load capacitance of the upstream stages, resulting in increased power consumption. With the present embodiment, the sampling capacitance is adjusted corresponding to the precision required by the system. This reduces the load capacitance, thereby reducing current consumption.

Figure 22:
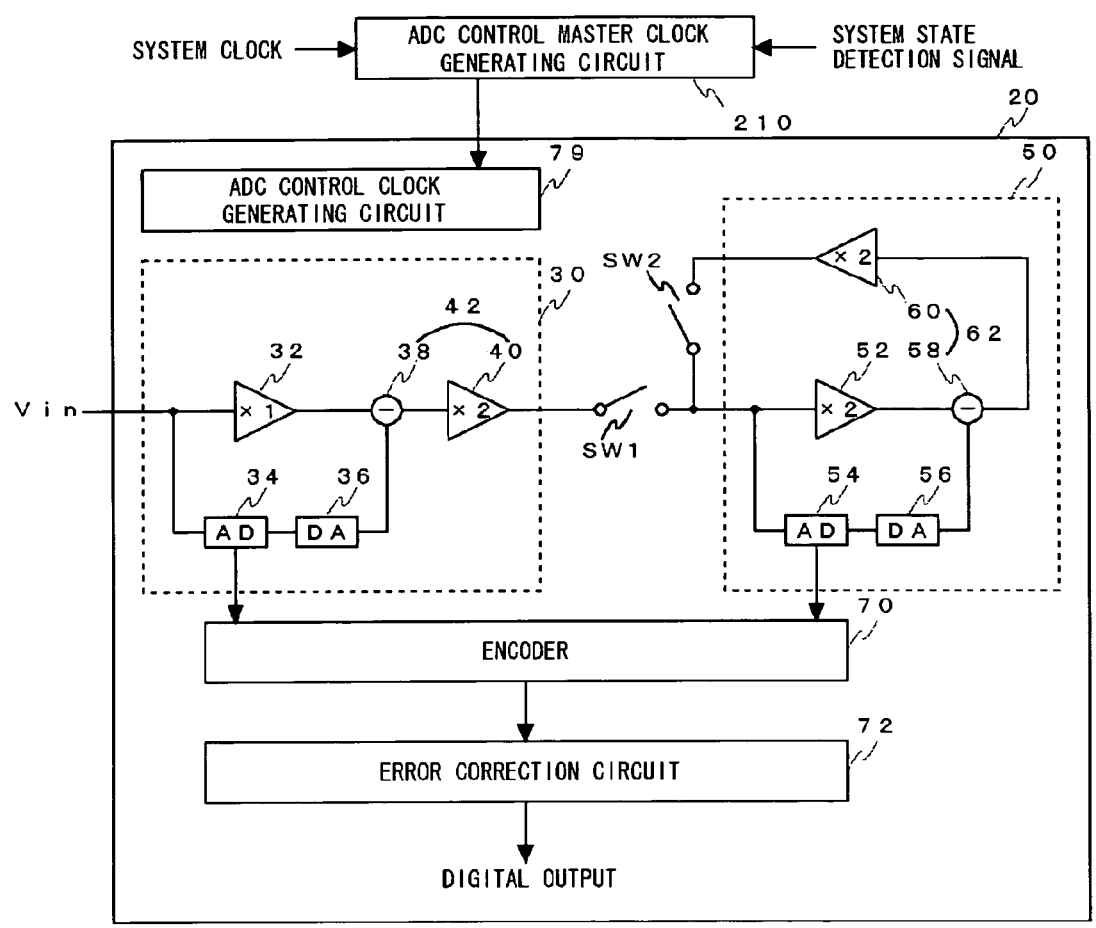
FIG. 22 is a diagram which shows an AD converter and an ADC control master clock generating circuit according to a ninth embodiment.

Next, description will be made regarding the AD converter 20 having a function which allows dynamic adjustment of the operating frequency thereof. FIG. 22 shows the AD converter 20 and an ADC control master clock generating circuit 210 according to a ninth embodiment. The configuration and operation of the AD converter 20 according to the ninth embodiment are essentially the same as with the AD converter 20 according to the first embodiment shown in FIG. 3. The ADC control master clock generating circuit 210 supplies a master clock for determining the operating frequency of the AD converter 20 to an ADC control clock generating circuit 79 within the AD converter 20. Specifically, the ADC control master clock generating circuit 210 generates a master clock, which is used for the AD converter 20, based upon a system clock generated by a quartz oscillator, according to a predetermined system state detection signal. The ADC control clock generating circuit 79 sets the operating frequency of the AD converter 20 based upon the master clock.

Figure 23:
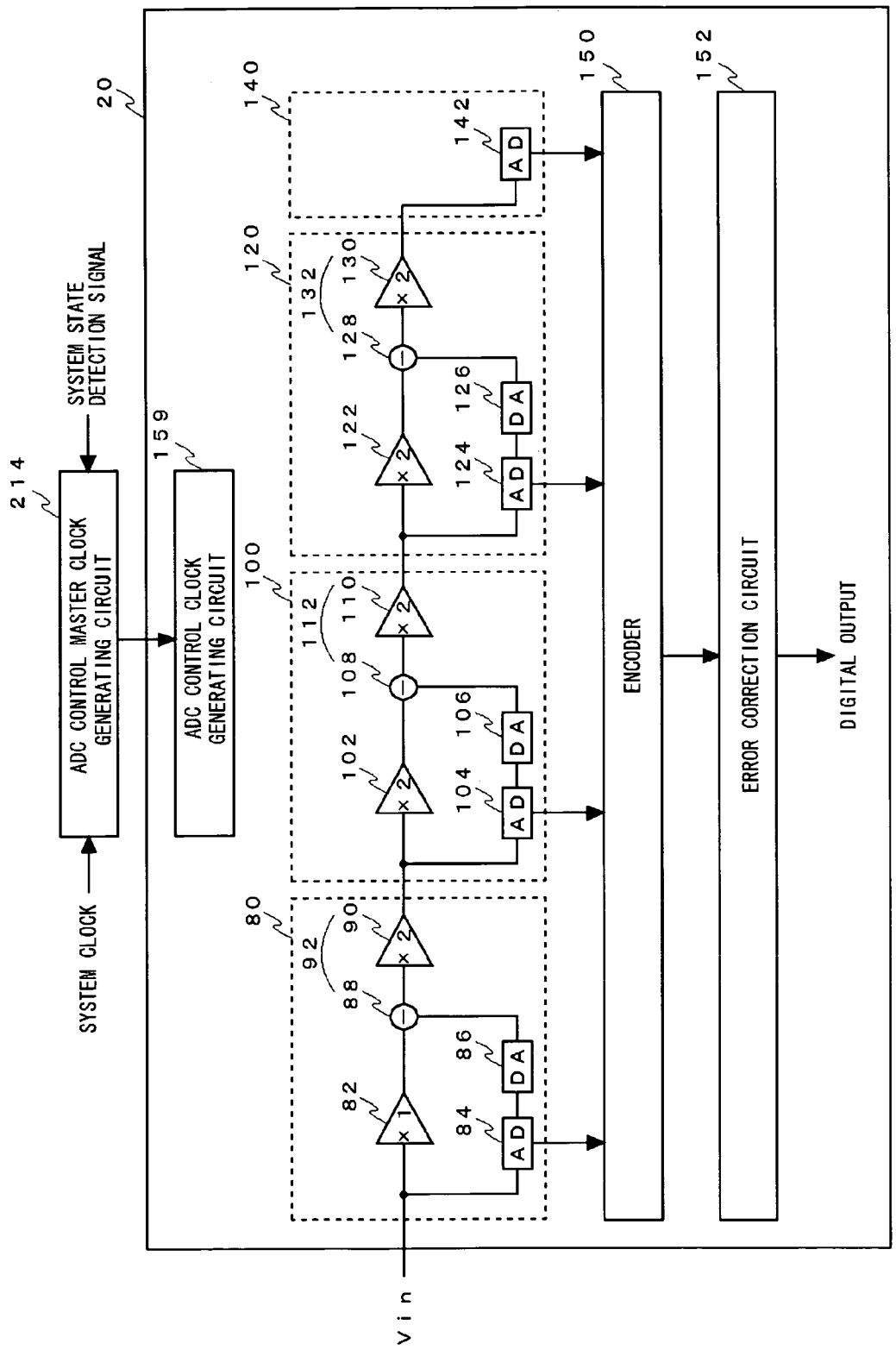
FIG. 23 is a diagram which shows an AD converter and an ADC control master clock generating circuit according to a tenth embodiment.

FIG. 23 shows the AD converter 20 and the ADC control master clock generating circuit 210 according to a tenth embodiment. The configuration and operation of the AD converter 20 according to the tenth embodiment are essentially the same as with the AD converter 20 according to the second embodiment shown in FIG. 6. The ADC control master clock generating circuit 210 supplies a master clock to an ADC control clock generating circuit 159 within the AD converter 20 for determining the operating frequency of the AD converter 20. The ADC control clock generating circuit 159 sets the operating frequency of the AD converter 20 based upon the master clock.

Each of the AD converters 20 according to the ninth and tenth embodiment includes amplifiers therewithin. With these embodiments, the operating frequency of the AD converter 20 is dynamically controlled corresponding to the AD conversion speed required by the system, thereby enabling adjustment of current consumption to the optimum level. Thus, such a configuration reduces current consumption of the AD converter 20. Also, an arrangement may be made in which the operating frequency of the AD converter 20 is dynamically adjusted corresponding to the precision required by the system, thereby reducing current consumption.

Specifically, in a case that the system requires high precision, each amplifier has the need of data settling for a long time, leading to reduced operating frequency. On the other hand, in a case that the system does not require high precision, there is no need of data settling for a long time as compared with a case where the system requires high precision. In this case, the AD converter 20 can operate with high operating frequency without any problems. Accordingly, in a case that the system does not require high precision, total time required for AD conversion can be reduced. Thus, the AD converter 20 according to the present embodiment has the advantage of current management in which the AD converter 20 is switched to the standby state or is turned off during a period that AD conversion is not being performed.

As described above, description has been made regarding the present invention with reference to the aforementioned embodiments. The above-described embodiments have been described for exemplary purposes only, and are by no means intended to be interpreted restrictively. Rather, it can be readily conceived by those skilled in this art that various modifications may be made by making various combinations of the aforementioned components or the aforementioned processing, which are also encompassed in the technical scope of the present invention. Description will be made below regarding modifications.

Description has been made regarding multiple embodiments which allow adjustment of the circuit configuration or the circuit parameter so as to reduce power consumption of the AD converter. It is needless to say that any combination of these embodiments are encompassed by the present invention.

Description has been made regarding an arrangement which allows the AD converter to switch between the 8-bit mode and the 10-bit mode. The present invention is not restricted to the 8-bit mode or 10-bit mode. For example, the AD converter shown in FIG. 3 can operate in the 6-bit, 8-bit, 10-bit, and 12-bit modes. Thus, an arrangement may be made which allows the AD converter to switch between any combination of these operating modes.

Also, the present invention is not restricted to an arrangement in which the AD converter includes a single cyclic stage as shown in FIG. 3. Rather, the AD converter may be formed of a single cyclic stage alone. Also, the AD converter may include three or more stages including at least one cyclic stage. With such an AD converter, an arrangement may be made which allows adjustment of the output bits by controlling the operating frequency.

Also, the operating timing of the AD converter according to the present invention is not restricted to the arrangements described in the above embodiments with reference to the time charts. Rather, any operating timing may be designed as long as each components of the AD converter operates as appropriate.

What is claimed is:

1. A signal processing system including an analog digital converter for converting an analog signal to a digital signal with predetermined bits comprising:
    a control unit for dynamically controlling the conversion bits of said analog digital converter,
    wherein said control unit controls said conversion bits by adjusting a ratio of an operating frequency to a sampling frequency of said analog digital converter.

2. A signal processing system according to claim 1, wherein said analog digital converter includes a stage in which an output of said stage is fed back to an input thereof;
    and wherein said control unit has a function of dynamic adjustment of an operating frequency supplied to said state.

3. A signal processing system including an analog digital converter for converting an analog signal to a digital signal with predetermined bits comprising:
    a control unit for dynamically controlling the conversion bits of said analog digital converter,
    wherein said control unit controls the conversion bits of said analog digital converter from a perspective of gain adjustment.

4. A signal processing system according to claim 3, wherein said analog digital converter includes a stage in which an output of said stage is fed back to an input thereof;
    and wherein said control unit has a function of dynamic adjustment of an operating frequency supplied to said stage.

5. A signal processing system including an analog digital converter for converting an analog signal to a digital signal with predetermined bits comprising:
    a control unit for dynamically controlling the conversion bits of said analog digital converter,
    wherein said control unit controls the conversion bits of said analog digital converter from a perspective of offset adjustment.

6. A signal processing system according to claim 5, wherein said analog digital converter includes a stage in which an output of said stage in which an output of said state is fed back to an input thereof;
    and wherein said control unit has a function of dynamic adjustment of an operating frequency supplied to said stage.

7. A signal processing system including an analog digital converter for converting an analog signal to a digital signal with predetermined bits comprising:
    a control unit for dynamically controlling a resolution of said analog digital converter;
    wherein said control unit controls said resolution by adjusting a ratio of an operating frequency to a sampling frequency of said analog digital converter.

8. A signal processing system including an analog digital converter for converting analog signal to a digital signal with predetermined bits comprising:
    a control unit for dynamically controlling a resolution of said analog digital converter,
    wherein said control unit controls the resolution of said analog digital converter from a perspective of gain adjustment.

9. A signal processing system including an analog digital converter for converting an analog signal to a digital signal with predetermined bits comprising:
    a control unit for dynamically controlling a resolution of said analog digital converter;
    wherein said control unit controls the resolution of said analog digital converter from a perspective of offset adjustment.

* * * * *